(12) United States Patent
Kono

(10) Patent No.: US 6,914,828 B2
(45) Date of Patent: Jul. 5, 2005

(54) SEMICONDUCTOR MEMORY DEVICE WITH STRUCTURE OF CONVERTING PARALLEL DATA INTO SERIAL DATA

(75) Inventor: Takashi Kono, Hyogo (JP)

(73) Assignee: Renesas Technology Corp., Tokyo (JP)

(*) Notice: Subject to any disclaimer, the term of this patent is extended or adjusted under 35 U.S.C. 154(b) by 87 days.

(21) Appl. No.: 10/440,188

(22) Filed: May 19, 2003

(65) Prior Publication Data

US 2004/0094780 A1 May 20, 2004

(30) Foreign Application Priority Data

Nov. 14, 2002 (JP) ........................................ 2002-330982

(51) Int. Cl.$^7$ .............................................. G11C 11/34
(52) U.S. Cl. ............................. 365/189.01; 365/189.04
(58) Field of Search ........................ 365/189.01, 189.04

(56) References Cited

U.S. PATENT DOCUMENTS 6,707,740 B2 * 3/2004 Shinozaki .................... 365/207

FOREIGN PATENT DOCUMENTS

JP 08-17184 1/1996
JP P2000-163969 A 6/2000

* cited by examiner

Primary Examiner—M. Tran
(74) Attorney, Agent, or Firm—McDermott Will & Emery LLP

(57) ABSTRACT

An amplifier circuit (R/A) conducts the first stage of ordering of whether to output data of four data bus pairs at the first half (first or second) or at the last half (third or fourth) based on the value of a signal EZORG1 reflecting the value of the least significant second bit of an externally applied column address. A switch circuit conducts the second stage of ordering to determine which is to be the first and the second of the two data output as the first half and to determine which is to be the third and the fourth of the two data output as the last half based on the value of a signal EZORG0 reflecting the value of the least significant bit in the externally applied column address.

7 Claims, 17 Drawing Sheets

| CA1 | CA0 | 1st | 2nd | 3rd | 4th |
|---|---|---|---|---|---|
| 0 | 0 | D0 (CA1=0, CA0=0) | D1 (CA1=0, CA0=1) | D2 (CA1=1, CA0=0) | D3 (CA1=1, CA0=1) |
| 0 | 1 | D1 (CA1=0, CA0=1) | D0 (CA1=0, CA0=0) | D3 (CA1=1, CA0=1) | D2 (CA1=1, CA0=0) |
| 1 | 0 | D2 (CA1=1, CA0=0) | D3 (CA1=1, CA0=1) | D0 (CA1=0, CA0=0) | D1 (CA1=0, CA0=1) |
| 1 | 1 | D3 (CA1=1, CA0=1) | D2 (CA1=1, CA0=0) | D1 (CA1=0, CA0=1) | D0 (CA1=0, CA0=0) |

FIG.11

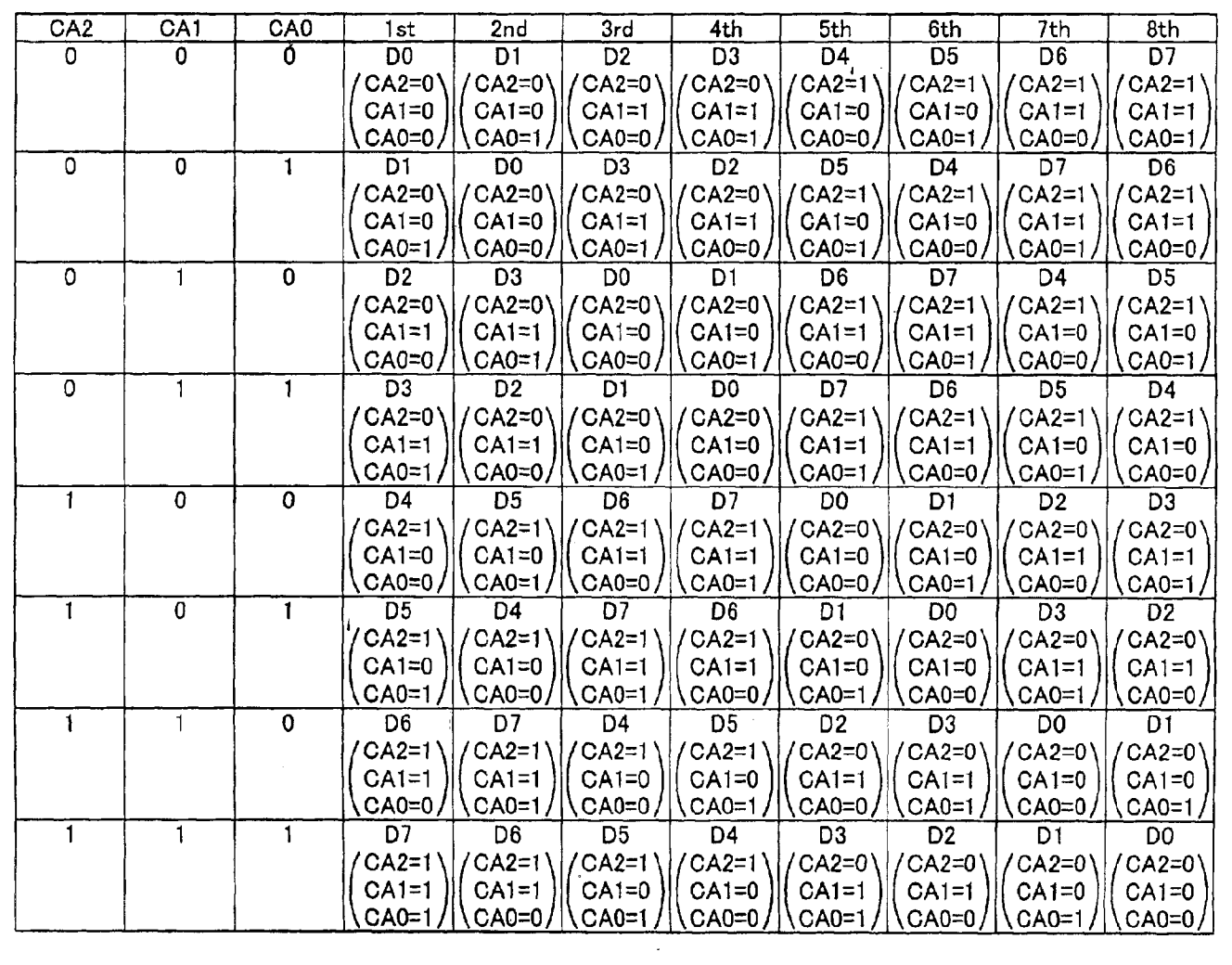

| CA2 | CA1 | CA0 | 1st | 2nd | 3rd | 4th | 5th | 6th | 7th | 8th |
|---|---|---|---|---|---|---|---|---|---|---|
| 0 | 0 | 0 | D0 | D1 | D2 | D3 | D4 | D5 | D6 | D7 |
| 0 | 0 | 1 | D1 | D0 | D3 | D2 | D5 | D4 | D7 | D6 |
| 0 | 1 | 0 | D2 | D3 | D0 | D1 | D6 | D7 | D4 | D5 |
| 0 | 1 | 1 | D3 | D2 | D1 | D0 | D7 | D6 | D5 | D4 |
| 1 | 0 | 0 | D4 | D5 | D6 | D7 | D0 | D1 | D2 | D3 |
| 1 | 0 | 1 | D5 | D4 | D7 | D6 | D1 | D0 | D3 | D2 |
| 1 | 1 | 0 | D6 | D7 | D4 | D5 | D2 | D3 | D0 | D1 |
| 1 | 1 | 1 | D7 | D6 | D5 | D4 | D3 | D2 | D1 | D0 |

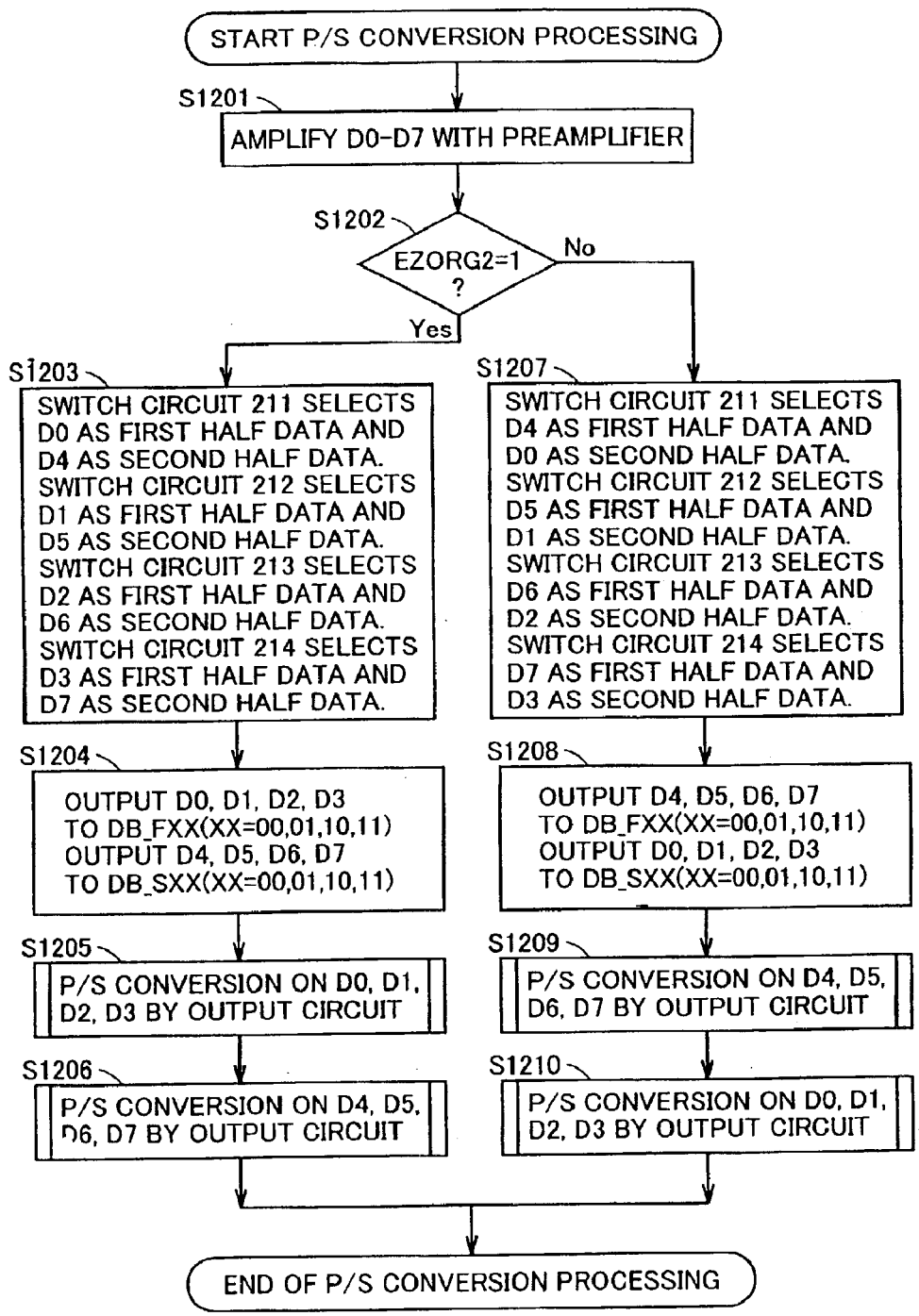

SEMICONDUCTOR MEMORY DEVICE WITH STRUCTURE OF CONVERTING PARALLEL DATA INTO SERIAL DATA

BACKGROUND OF THE INVENTION

1. Field of the Invention

The present invention relates to semiconductor memory devices, particularly to a DDR (Double Data Rate) SDRAM (Synchronous Dynamic Random Access Memory) that carries out a prefetch operation.

2. Description of the Background Art

Among synchronous dynamic random access memories (SDRAM) operating in synchronization with an externally applied clock signal, the SDRAM having data input/output conducted in synchronization with the rising edge and falling edge of an external clock signal is called a double data rate synchronous dynamic random access memory (Double Data Rate SDRAM; referred to as DDR SDRAM hereinafter).

In such a DDR SDRAM, it is postulated that reading out data from a memory cell array conducted at the external clock cycle period is based on a prefetch operation in which a plurality of bits of data are read out to respective output circuits in one read out operation.

The structure and operation of such a DDR SDRAM carrying out a prefetch operation is disclosed in, for example, Japanese Patent Laying-Open No. 8-17184.

The DDR SDRAM that conducts a prefetch operation has a structure in which data of $2^N$ bits are read out at one time from a memory cell array to the output circuit for every one cycle of an external clock. At the output circuit, the $2^N$ bits of data are sequentially set in order to be output for every half cycle of the external clock.

A DDR SDRAM of N=1 is termed "DDR-I" whereas a DDR SDRAM of N=2 is termed "DDR-II". DDR-I and DDR-II have their specification defined by the JEDEC (Joint Electron Device Engineering Council).

The DDR SDRAM conducting a prefetch operation of $2^N$ data has a chip operating frequency and a data transfer rate per 1 pin that is $2^{N-1}$ times the chip operating frequency and $2^N$ times the data transfer rate of a DDR SDRAM that does not conduct a prefetch operation.

Specifically, when one cycle period Tca is 6 ns, an SDR (Single Data Rate) SDRAM that does not conduct a prefetch operation has an operating frequency of 166 MHz and a data transfer rate per 1 pin of 166 MHz.

In contrast, for a DDR SDRAM that conducts a prefetch operation of N=1 (DDR-I), the operating frequency is 166 MHz and the data transfer rate per 1 pin is 333 MHz. A DDR SDRAM (DDR-II) that conducts a prefetch operation of N=2 has an operating frequency of 333 MHz and a data transfer rate of 666 MHz per 1 pin.

However, the problems set forth below are noted in an output circuit that converts parallel data read out simultaneously by the aforementioned prefetch operation sequentially into serial data (parallel/serial conversion: referred to as "P/S conversion" hereinafter).

For example, in the case of a 4-bit prefetch (N=2), 16 selectors will be required per 1 DQ terminal, resulting in increase of the circuit complexity of the output circuit.

Furthermore, the line length in the output circuit will be increased to disable high speed P/S conversion.

SUMMARY OF THE INVENTION

In view of the foregoing, an object of the present invention is to provide a semiconductor memory device of low complexity that allows high speed P/S conversion of prefetched data.

According to an aspect of the present invention, a semiconductor memory device includes a plurality of memory cells arranged in a matrix, a read circuit reading out simultaneously data of $2^N$ ($N \geq 2$) memory cells in the plurality of memory cells to output the data to $2^N$ pairs of data buses based on an externally applied column address, and an output circuit sequentially setting in order in K ($2 \leq K \leq N$) stages the data of the $2^N$ pairs of data buses based on the externally applied column address.

By conducting the P/S conversion of the prefetched data in multiple stages in the semiconductor memory device of the present invention, the complexity of the semiconductor memory device can be reduced. Also, P/S conversion can be conducted at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows the relationship between the least significant three bits CA2, CA1 and CA0 of an externally applied column address CA and the output order of eight data.

FIG. 14 is a flow chart of the P/S conversion procedure in a read circuit and output circuit according to an embodiment of the present invention.

DESCRIPTION OF THE PREFERRED EMBODIMENTS

Embodiments of the present invention will be described hereinafter with reference to the drawings.

First Embodiment

Figure 1:
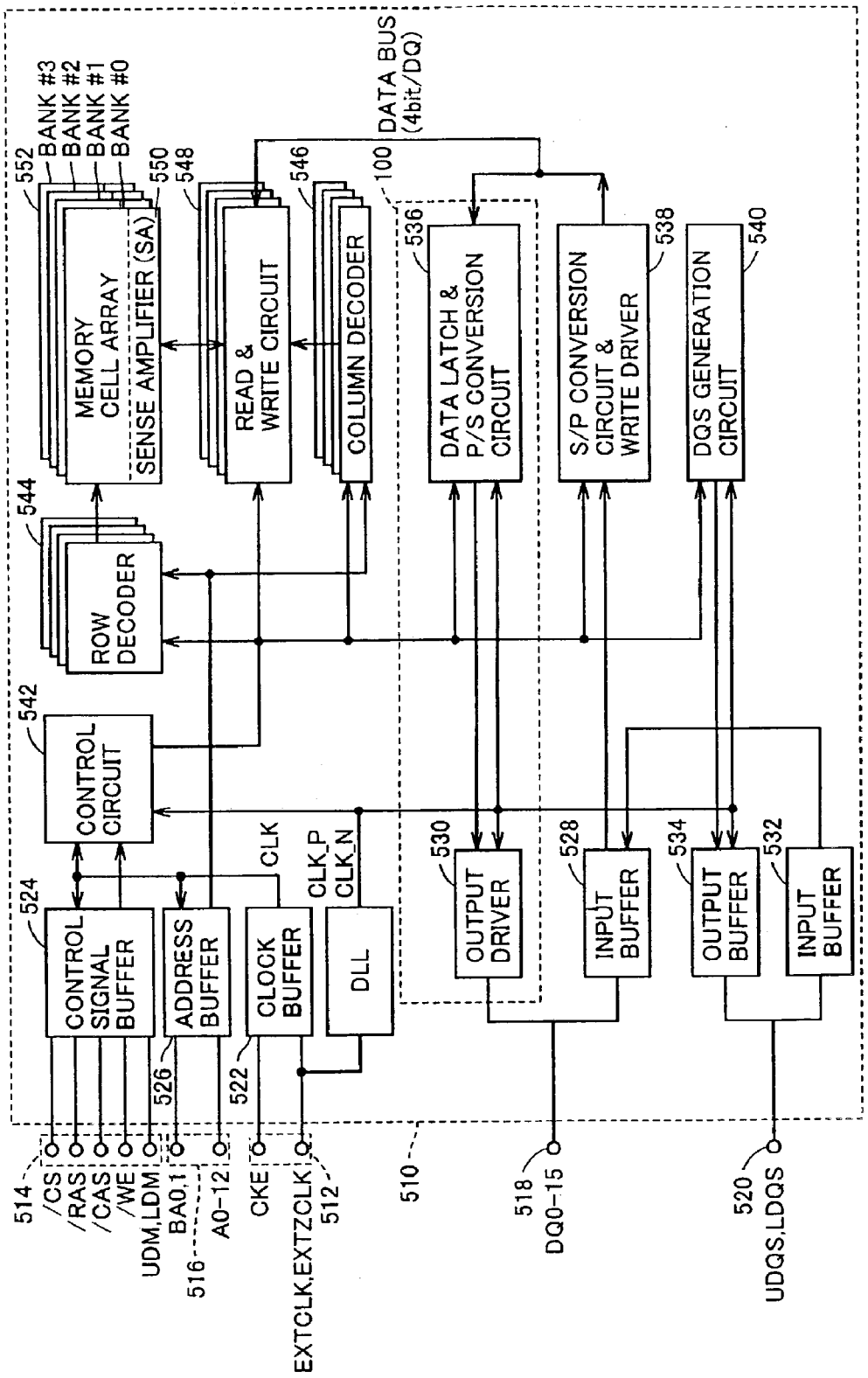
FIG. 1 is a schematic block diagram of an entire structure of a semiconductor memory device 510.

FIG. 1 is a schematic block diagram of an entire structure of a semiconductor memory device 510 according to a first embodiment of the present invention, illustrating only the main part related to data input/output.

Referring to FIG. 1, semiconductor memory device 510 includes a clock terminal 512, a control signal terminal 514, an address terminal 516, a data input/output terminal 518, a data strobe signal input/output terminal 520, a clock buffer 522, a control signal buffer 524, an address buffer 526, an input buffer 528 for data DQ0–DQ15, an input buffer 532 and an output buffer 534 related to data strobe signals UDQS and LDQS, an output circuit 100, an S/P (serial/parallel) conversion circuit & write driver 538, a DQS generation circuit 540, a DDL circuit 541, an output circuit 100, a control circuit 542, a row decoder 544, a column decoder 546, a read & write circuit 548, a sense amplifier 550, and a memory cell array 552.

Semiconductor memory device 510 of the first embodiment is the DDR-II. Specifically, semiconductor memory device 510 has a 4-bit prefetch structure in which data of 4×n bits ("n" is the bit width of the semiconductor device, i.e. the number of DQ terminals; n=16 in semiconductor memory device 510) are read out at one time in a data read out operation from memory cell array 552 carried out in an external clock cycle. 4-bit data is read out from memory cell array 552 with respect to n output circuits 100 for every one external clock cycle. At each output circuit 100, data of 4 bits are set in order to be transferred at half the cycle period to be output.

In a data writing operation, semiconductor memory device 510 fetches n bits (n=16) of data per half an external clock cycle in synchronization with the rise and fall of an external clock to write data of 4×n bits at one time into memory cell array 552 at one external clock cycle.

Memory cell array 552 is formed of a plurality of memory cells, each cell storing data. Memory cell array 552 is divided into four banks. Each bank is operable independently.

Clock terminal 512 receives external clock signals EXTCLK and EXTZCLK complementary to each other, and a clock enable signal CKE. Control signal terminal 514 receives a chip select signal /CS, a row address strobe signal /RAS, a column address strobe signal /CAS, a write enable signal /WE, and command control signals of input data mask signals UDM and LDM.

Address terminal 516 receives address signals A0–A12 and bank address signals BA0 and BA1.

Data input/output terminal 518 is a terminal to input/output the data read and written in semiconductor memory device 510 with an external source. Data input/output terminal 518 receives externally applied data DQ0–DQ15 in a data writing mode, and outputs data DQ0–DQ15 to an external source in a data reading mode.

Data strobe signal input/output terminal 520 receives externally applied data strobe signals UDQS, LDQS required to read in data DQ0–DQ15 from an external source in a data writing mode, and outputs data strobe signals UDQS, LDQS required for an external controller to read in data DQ0–DQ15 in a data reading mode.

Clock buffer 522 receives external clock signals EXTCLK, EXTZCLK and clock enable signal CKE to generate an internal clock signal. The internal clock signal is output to control signal buffer 524, address buffer 526 and DLL circuit 541.

Control signal buffer 524 fetches and latches, in synchronization with an internal clock from clock buffer 522, a chip select signal /CS, a row address strobe signal /RAS, a column address strobe signal /CAS, a write enable signal /WE and input data mask signals UDM and LDM, and provides the command control signals to control circuit 542.

Address buffer 526 fetches and latches address signals A0–A12 and bank address signals BA0 and BA1 in synchronization with the internal clock signal from clock buffer 522 to generate and provide to row decoder 544 and column decoder 546 an internal address (row address XA and column address CA).

Row decoder 544 executes row selection in memory cell array 510 according to row address XA. Specifically, control is provided of selective activation of a word line (not shown) disposed for every memory cell row in memory cell array 510.

Column decoder 546 executes column selection in memory cell array 510 according to column address CA. Specifically, a plurality of sense amplifiers are selectively connected to read & write circuit 548 via an I/O line (not shown) in memory cell array 510. In the 4-bit prefetch scheme, column decoder 546 selects a column specified by four column addresses CA all having common upper bits but the least significant 2 bits corresponding to a column address CA generated at address buffer 526.

Sense amplifier 550 is coupled with a bit line corresponding to the selected column result to amplify the voltage of the bit line of the selected column.

Read and write circuit 548 includes a read circuit 600 amplifying and providing to a data bus pair the data in a memory cell, and a write circuit 610 amplifying and providing to a memory cell the data of a data bus pair.

Figure 2:
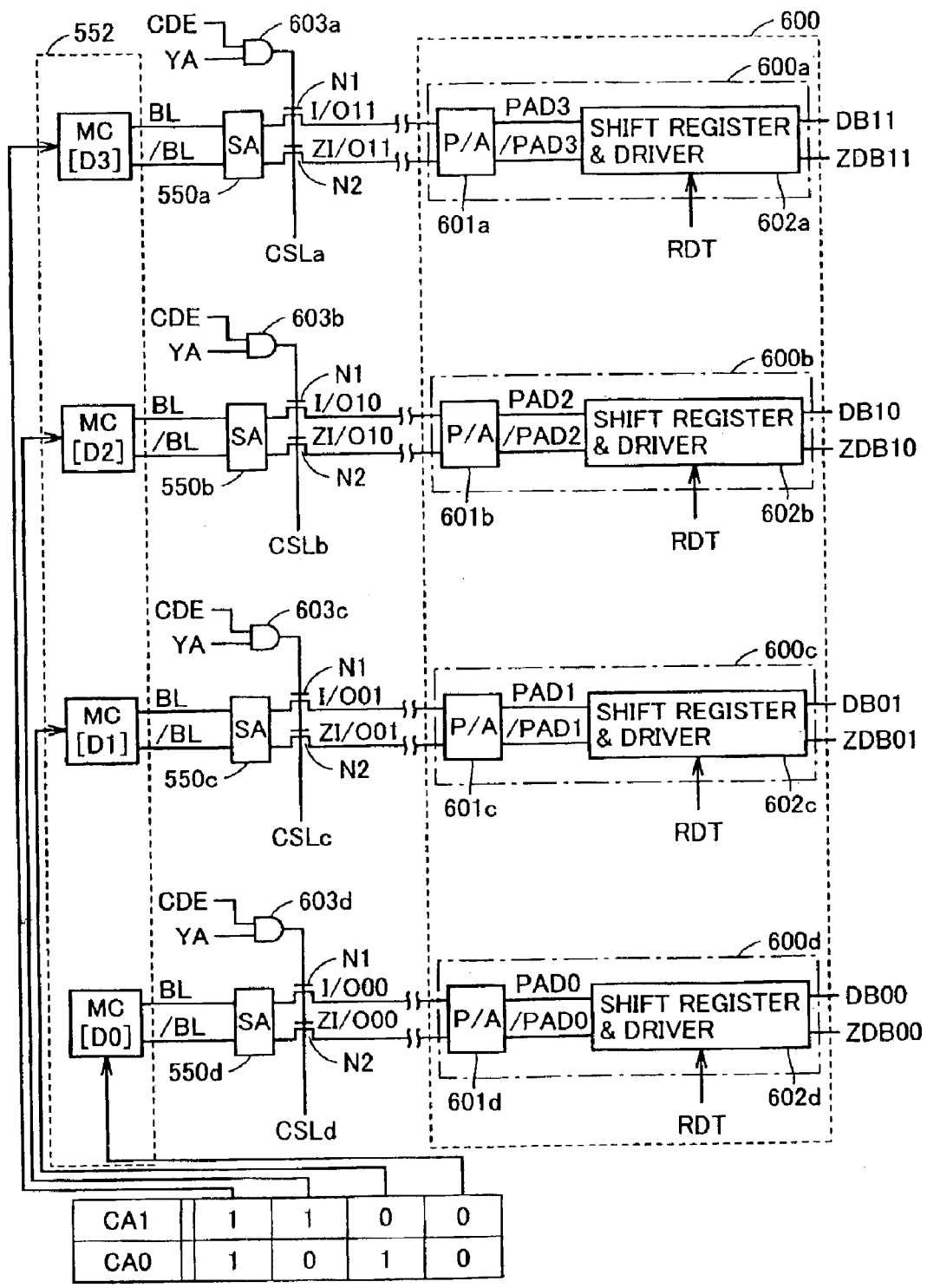
FIG. 2 is a functional block diagram to describe the flow of data with respect to one DQ terminal in memory cells of a memory cell array 552, a sense amplifier circuit 550, and a read circuit 600.

FIG. 2 is a functional block diagram to describe the flow of data for one DQ terminal in memory cell MC in memory cell array 552, sense amplifier 550 and read out circuit 600.

FIG. 2 shows a structure to read out in parallel data from memory cells of a column specified by four column addresses CA all having common upper bits but the least significant 2 bits corresponding to a column address CA generated at address buffer 526. In the present specification, the least significant bit of column address CA is represented as "CA0", and the next least significant bit is represented as "CA1".

Sense amplifiers 550a–550d sense and amplify the data read out to respective connected pair of bit lines BL and /BL.

At an elapse of a predetermined period of time, decode signal YA and column decode enable signal CDE attain an H level (logical high). AND gates 603a–603d provide H outputs, whereby column select lines CSLa–CSLd are respectively selected.

Accordingly, data D3 of the memory cell specified by CA1=1 and CA0=1 from sense amplifier 550*a* is output to I/O line pair I/O11, ZI/O11. Data D2 of the memory cell specified by CA1=1 and CA0=0 from sense amplifier 550*b* is output to I/O line pair I/O10, ZI/O10. Data D1 of the memory cell specified CA1=0 and CA1=1 is output from sense amplified 550*c* to I/O line pair I/O01, ZI/O01. Data D0 of the memory cell specified by CA1=0 and CA0=0 is output from sense amplifier 550*d* to I/O line pair I/O00, ZI/O00.

Read circuits 600*a*–600*d* include amplifier circuits (P/A) 601*a*–601*d*, and shift register & drivers 602*a*–602*d*.

Amplifier circuits (P/A) 601*a*–601*d* amplify the data of respective connected I/O line pairs and provide the amplified data to respective selected data line pairs PADn (n=0–3).

Shift register & drivers 602*a*–602*d* retain the data input from respective connected data line pair PADn (n=0–3) until control signal RDT generated at control circuit 542 attains an H level. In response to control signal RDT going high, the input data is reduced in amplitude to be output to respective connected data bus pair DBXX (XX=00, 01, 10, 11).

Thus, in response to an externally applied column address CA, the data of four memory cells specified by four column addresses CA all having common upper bits but the least significant two bits are read out in parallel to each data bus pair. These common upper bits are identical to all upper bits but the least significant N bits of an externally applied column address CA.

Specifically, data D0 of the memory cell in the column specified by CA1=1 and CA0=0 is output to data bus pair DB00 and ZDB00. Data D1 of the memory cell in the column specified by CA1=0 and CA0=1 is output to data bus pair DB01 and ZDB01. Data D2 of the memory cell in the column specified by CA1=1 and CA1=0 is output to data bus pair DB10 and ZDB10. Data D3 of the memory cell in the column specified by CA0=1 and CA0=1 is output to data bus pair DB11 and ZDB11.

Output circuit 100 is formed of data latch & P/S conversion circuit 536 and an output driver 530.

Data latch & P/S conversion circuit 536 in a data read mode responds to control signals EZORG0, EZORG1 and ZRDA1 applied from control circuit 542 to amplify the read out data from read & write circuit 548. Data latch & P/S conversion circuit 536 applies P/S (parallel/serial conversion) on the amplified data. Specifically, data latch & P/S conversion 536 sets in order the four data (parallel data) read out at one time with respect to each data DQi (i: 0–15), i.e. converts into serial data, for output to output driver 530 in the 4-bit prefetch scheme. The least significant two bits of the externally applied column address CA, i.e. CA1 and CA0, determine the output sequence of the four data.

Figures 3, 4:
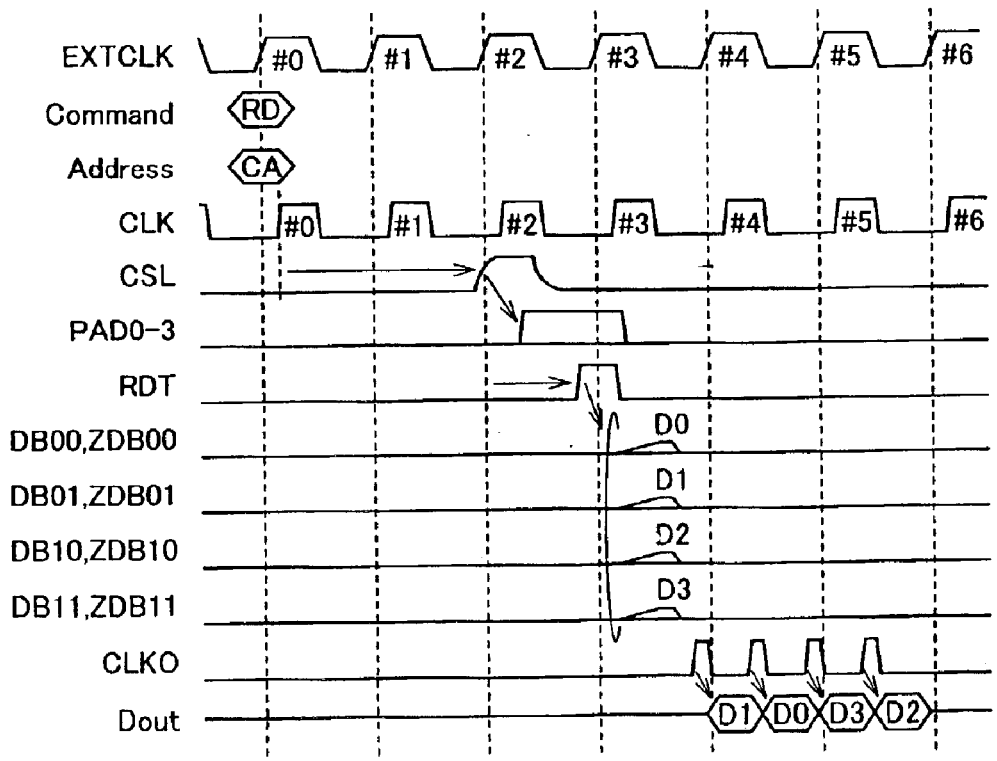
FIG. 3 shows the relationship between the least significant two bits CA1 and CA0 of an externally applied column address CA and the output order of 4 data.
FIG. 4 is a timing chart of data output when data is read out from DDR-II.

FIG. 3 shows the relationship between the least significant two bits, CA1 and CA0, of externally applied column address CA and the output order of the four data (when addressing is effected in an interleave manner). When externally applied column address CA has CA1=0 and CA0=0, data is output in the order of D0 (specified by CA1=0, CA0=0)→D1 (specified by CA1=0, CA0=1)→D2 (specified by CA1=1, CA0=0)→D3 (specified by CA1=1, CA0=1).

When externally applied column address CA has CA1=0 and CA0=1, data is output in the order of D1 (specified by CA1=0, CA0=1)→D0 (specified by CA1=0, CA0=0)→D3 (specified by CA1=1, CA0=1)→D2 (specified by CA1=1, CA0=0)).

When externally applied column address CA has CA1=1 and CA0=1, data is output in the order of D2 (specified by CA1=1, CA0=0)→D3 (specified by CA1=1, CA0=1,→D0 (specified by CA1=0, CA0=0)→D1 (specified by CA1=0, CA0=1).

When externally applied column address CA has CA1=1 and CA0=1, data is output in the order of D3 (specified by CA1=1, CA0=1)→D2 (specified by CA1=1, CA0=0)→D1 (specified by CA1=0, CA0=1)→D0 specified by CA1=0, CA0=0).

Thus, the data of the memory cell in the column specified by externally applied column address CA is first output. The two memory cells from which the former two data are output has the same value for CA1 whereas the two memory cells from which the latter two data are output have the same value for column address CA1.

Output driver 530 provides serial-converted data DQ0–DQ15 to data input/output terminal 518.

In a data write mode, S/P conversion circuit & write driver 538 provides each data DQi received from input buffer 528 on a bit-by-bit basis per half external clock cycle to read & write circuit 548 in a 4-bit parallel form for every one external clock cycle according to the 4-bit prefetch scheme.

Input buffer 532 receives externally applied data strobe signals UDQS and LDQS.

Input buffer 528 accepts data DQ0–DQ15 in synchronization with data strobe signals UDQS and LDQS received at input buffer 532.

Output buffer 534 fetches data strobe signals of UDQS and LDQS generated by DQS generation circuit 540 that operates in synchronization with the output of DLL circuit 511. Output buffer 534 operates together with output driver 530 from which data DQ0–DQ15 are output in synchronization with the output of DLL circuit 541 to provide data strobe signals UDQS and LDQS to data strobe signal input/output terminal 520.

In synchronization with the output of clock buffer 522, control circuit 542 fetches the command control signal from control signal buffer 524 to control row decoder 544, column decoder 546 and read & write circuit 548 based on the input command control signal. Accordingly, reading/writing of data DQ0–DQ15 is effected with respect to memory cell array 552. Control circuit 542 also controls the generation of the data strobe signal in DQS generation circuit 540 based on the input command control signal.

Furthermore, control circuit 542 controls generation of control signals RDT, EZORG0, EZORG1 and ZRDA1.

Specifically, control circuit 542 shifts address bits CA0 and CA1 by an appropriate cycle according to the CAS latency (described afterwards) to generate and provide to output circuit 100 control signals EZORG0 and EZORG1. Control circuit 542 sets EZORG1="1" and EZORG1="0" when CA1=0 and CA1=1, respectively. Control circuit 542 sets EZORG0="1" and EZORG0="0" when CA0=0 and CA0=1, respectively.

Control circuit 542 is triggered by DLL clocks CLK_P, CLK_N to set control signal RDT at an H level.

In response to control signal RDT attaining an H level, control circuit 542 sets control signal ZRDAI to an H level.

DLL (Delay Locked Loop) circuit 541 generates internal clock signals CLK_P, CLK_N that are delayed versions of external clock signal EXTCLK for the purpose of limiting the timing difference tAC between the edges of external clock signals EXTCLK, EXTZCLK and the output of data DQ to be within a predetermined range. Triggered by these internal clock signals CLK_P, CLK_N, the data read out from a memory cell is sequentially processed at read circuit 600 and output circuit 100 to be output from data input/output terminal 518.

FIG. 4 shows the timing of data output in a data read mode from DDR-II. The DRAM is set to have a CAS latency CL of 4, a bit length BL of 4, and the addressing to interleave Int. with 4 bits as the number of prefetched data. The CAS latency represents the number of cycles from reception of an externally applied READ command (a command to read out data) at DDR-II to the start of an output of the read data. Here, it is assumed that 1 cycle corresponds to one rising time point to the next rising time point of external clock signal EXTCLK. The burst length represents the number of bits that will be read out continuously in response to a READ command.

Referring to FIG. 4, external clock EXTCLK repeats a high level (also referred to as "H" level hereinafter) and a low level (also referred to as "L" level hereinafter) at a predetermined cycle.

First, a word line WL corresponding to a row address is pulled up to the selected level of H by row decoder 544, whereby data corresponding to the data in the memory cell is output to bit line pair BL and /BL. Then, sense amplifier 505 is rendered active, whereby the data of bit line pair BL and /BL is amplified.

At the rising edge of external clock signal EXTCLK#0, a READ command (/RAS=H, /CAS=L, /WE=H) and column address CA are accepted.

Then, column decoder 546 selects four column select lines CSLa–CSLd specified by addresses all having common upper bits but the least significant two bits corresponding to column address CA. The data of bit line pair BL and /BL corresponding to column select lines CSLa–CSLd is output to data line pair PADn, /PADn (n=0–3) via an I/O line pair to be retained at shift register & drivers 602a–602d.

Based on external clock signal EXCLK#2, control circuit 542 renders control signal RDT active. In synchronization with this activation, data retained in shift register & drivers 602a–602d are output onto data bus pairs DBn, ZDBn (n=00, 01, 10, 11).

Output circuit 100 P/S converts data D0, D1, D2 and D3 of data bus pair DBn, ZDBn (n=00, 01, 10, 11) to output data D0–D3 to an external source in synchronization with the edge of a clock signal CLK0 corresponding to the OR operation of DLL clocks CLK_P, CLK_N.

Thus, 4 bits of data signals (per one data input/output terminal) are read out continuously.

(Conventional Structure)

Configuration of P/S conversion will be described in detail hereinafter.

Figure 5:
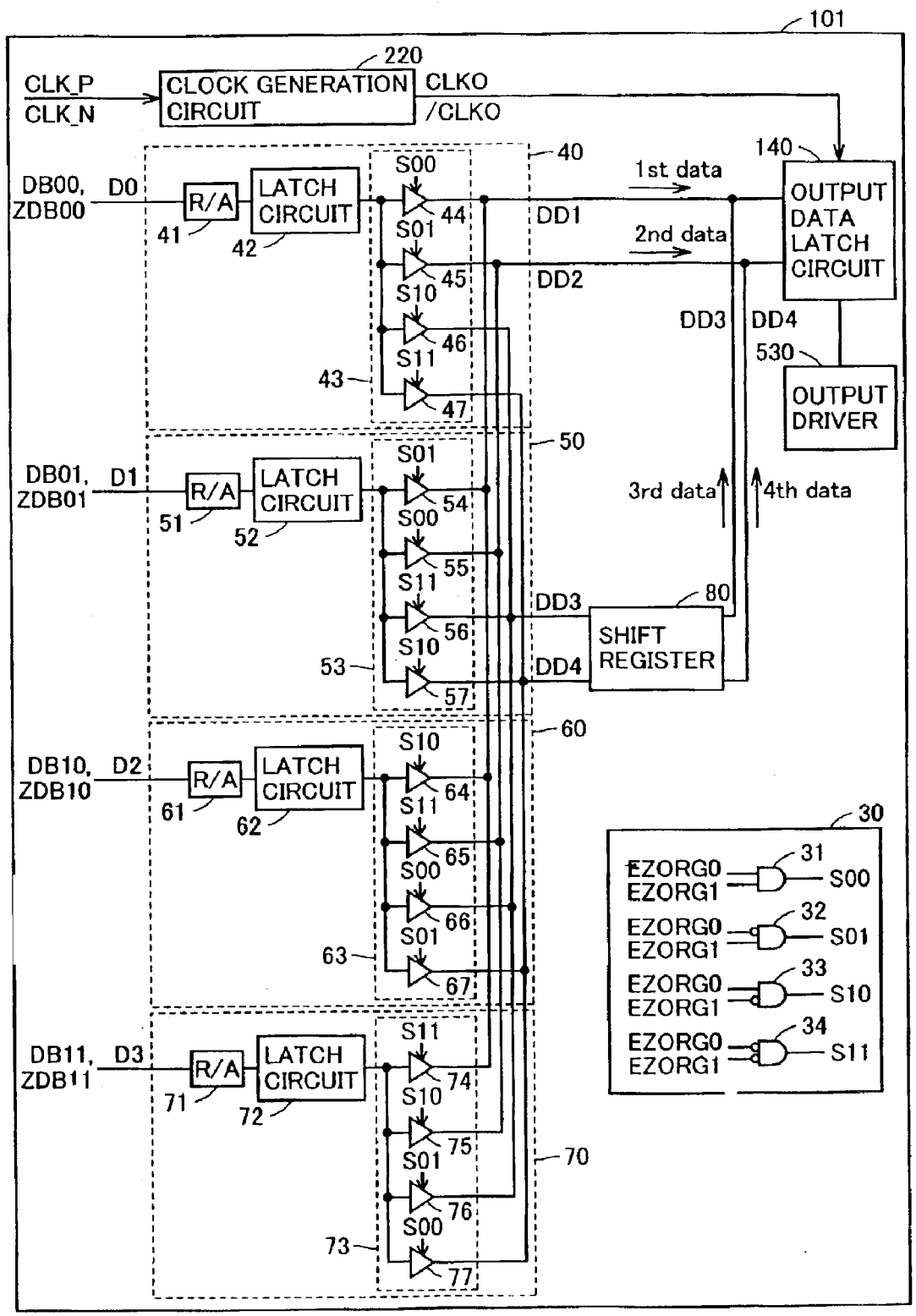
FIG. 5 shows a structure of a conventional output circuit (per 1 DQ terminal).

FIG. 5 shows a structure of a conventional output circuit (per 1DQ terminal). Referring to FIG. 5, output circuit 101 includes a control signal generation circuit 30, a clock generation circuit 220, an output data latch circuit 140, and an output driver 530.

Output circuit 101 also includes amplification & select circuits 40, 50, 60 and 70 for each data bus pair.

Clock generation circuit 220 generates and provides to output data latch circuit 140 an output trigger signal CLKO that is a clock signal corresponding to the OR operation of DLL clocks CLK_P, CLK_N and a signal /CLKO complementary to output trigger signal CLKO.

Control signal generation circuit 30 receives control signals EZORG0 and EZORG1 from control circuit 542. EZORG0 is set to 1 and 0 when CA0=0 and CA0=1, respectively, by control circuit 542. EZORG1 is set to 1 and 1 when CA1=0 and CA1=1, respectively.

AND circuit 31 receives control signals EZORG0 and EZORG1 to output a control signal S00. AND circuit 32 receives an inverted signal of EZORG0 and signal EZORG1 to output a control signal S01. AND circuit 33 receives signal EZORG0 and the inverted signal of EZORG1 to output a control signal S10. AND circuit 34 receives inverted signals of EZORG0 and EZORG1 to output a control signal S11.

Amplify & select circuit 40 includes an amplifier circuit (R/A) 41, a latch circuit 42, and a switch circuit 43.

Figure 6A:
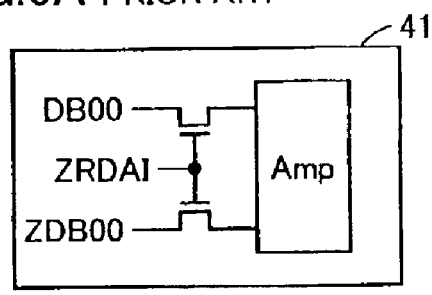
FIGS. 6A, 6B, 6C and 6D show a structure of an amplifier circuit (R/A) 41, an amplifier circuit (R/A) 51, an amplifier circuit (R/A) 61 and an amplifier circuit (R/A) 71, respectively.

Amplifier circuit (R/A) 41 shown in FIG. 6A responds to activation of control signal ZRDAI to amplify data D0 of data bus pair DB00, ZDB00.

Latch circuit 42 retains the data amplified by amplifier circuit 41.

Switch circuit 43 includes selectors 44, 45, 46 and 47. When control signal S00 is at an H level, selector 44 provides data D0 output from latch circuit 42 onto data line DD1 as the first data. When control signal S00 is at an L level, data D0 from latch circuit 42 is not output. When control signal S01 is at an H level, selector 45 outputs data D0 from latch circuit 42 onto data line DD2 as the second data. When control signal S01 is at an L level, data D0 from latch circuit 42 is not output. When control signal S10 is at an H level, selector 42 provides data D0 from latch circuit 42 onto data line DD3 as the third data. When control signal S10 is at an L level, data D0 from latch circuit 42 is not output. When control signal S11 is at an H level, selector 47 outputs data D0 from latch circuit 42 onto data line DD4 as the fourth data. When control signal S11 is at an L level, data D0 from latch circuit 42 is not output.

Amplify & select circuit 50 includes an amplifier circuit 51, a latch circuit 52, and a switch circuit 53.

Figure 6B:
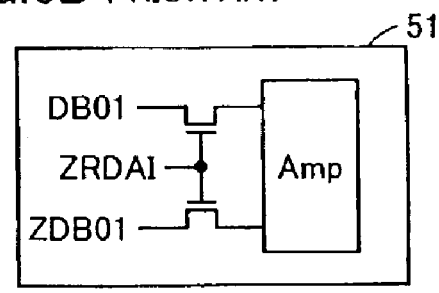

Amplifier circuit (R/A) 51 shown in FIG. 6B responds to activation of control signal ZRDAI to amplify data D1 of data bus pair DB01, ZD01.

Latch circuit 52 retains the data amplified by amplifier circuit 51.

Switch circuit 53 includes selectors 54, 55, 56 and 57. When control signal S01 is at an H level, selector 54, provides data D1 output from latch circuit 52 onto data line DD1 as the first data. When control signal S01 is at an L level, data D1 from latch circuit 52 is not output. When control signal S00 is at an H level, selector 55 outputs data D1 from latch circuit 52 onto data line DD2 as the second data. When control signal S00 is at an L level, data D1 from latch circuit 52 is not output. When control signal S11 is at an H level, selector 56 provides data D1 from latch circuit 52 onto data line DD3 as the third data. When control signal S11 is at an L level, data D1 from latch circuit 52 is not output. When control signal S10 is at an H level, selector 57 outputs data D1 from latch circuit 52 onto data line DD4 as the fourth data. When control signal S10 is at an L level, data D1 from latch circuit 52 is not output.

Amplify & select circuit 60 includes an amplifier circuit 61, a latch circuit 62, and a switch circuit 63.

Figure 6C:
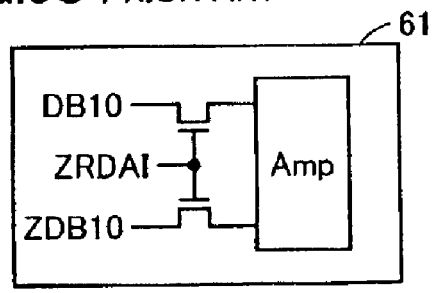

Amplifier circuit (R/A) 61 shown in FIG. 6C responds to activation of control signal ZRDAI to amplify data D2 of data bus pair DB10, ZDB10.

Latch circuit 62 retains the data amplified by amplifier circuit 61.

Switch circuit 63 includes selectors 64, 65, 66 and 67. When control signal S10 is at an H level, selector 64 provides data D2 output from latch circuit 62 onto data line DD1 as the first data. When control signal S10 is at an L level, data D2 from latch circuit 62 is not output. When control signal S11 is at an H level, selector 65 outputs data D2 from latch circuit 62 onto data line DD2 as the second data. When control signal S11 is at an L level, data D2 from latch circuit 62 is not output. When control signal S00 is at an H level, selector 62 provides data D2 from latch circuit 62 onto data line DD3 as the third data. When control signal S00 is at an L level, data D2 from latch circuit 62 is not output. When control signal S01 is at an H level, selector 67 outputs data D2 from latch circuit 62 onto data line DD4 as the fourth data. When control signal S01 is at an L level, data D2 from latch circuit 62 is not output.

Amplify & select circuit 70 includes an amplifier circuit 71, a latch circuit 72, and a switch circuit 73.

Figure 6D:
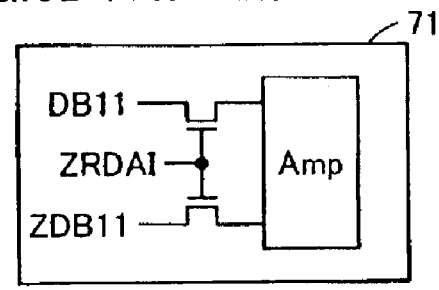

Amplifier circuit (R/A) 71 shown in FIG. 6D responds to activation of control signal ZRDAI to amplify data D3 of data bus pair DB11, ZDB11.

Latch circuit 72 retains the data amplified by amplifier circuit 71.

Switch circuit 73 includes selectors 74, 75, 76 and 77. When control signal S11 is at an H level, selector 74 provides data D3 output from latch circuit 72 onto data line DD1 as the first data. When control signal S11 is at an L level, data D3 from latch circuit 72 is not output. When control signal S10 is at an H level, selector 75 outputs data D3 from latch circuit 72 onto data line DD2 as the second data. When control signal S10 is at an L level, data D3 from latch circuit 72 is not output. When control signal S01 is at an H level, selector 76 provides data D3 from latch circuit 72 onto data line DD3 as the third data. When control signal S01 is at an L level, data D3 from latch circuit 72 is not output. When control signal S00 is at an H level, selector 77 outputs data D3 from latch circuit 72 onto data line DD4 as the fourth data. When control signal S00 is at an L level, data D3 from latch circuit 72 is not output.

Shift register 80 is provided during the passage of data lines DD3 and DD4 to retain the third and fourth data which are output at an elapse of 1 cycle.

Output data latch circuit 140 is triggered by the rise of signal CLK0 at every half cycle to fetch and provide to output driver 530 the first, second, third, or fourth data.

In output circuit 101, the output order of data corresponding to the values of CA1 and CA0 are set forth below.

When <CA1, CA0>=<0, 0>, <EZORG1, EZORG0>=<1, 1> is established. Here, <S00, S01, S10, S11>=<1, 0, 0, 0> is established. Accordingly, data D0 on data bus line pair DB00, ZDB00 is output as the first data. Data D1 on data bus pair DB01, ZDB01 is output as the second data. Data D2 on data bus pair DB10, ZDB10 is output as the third data. Data D3 on data bus pair DB11, ZDB11 is output as the fourth data. Thus, the data is output in the order of D0→D1→D2→D3.

When <CA1, CA0>=<0, 1>, <EZORG1, EZORG0>=<1, 0> is established. Here, <S00, S01, S10, S11>=<0, 1, 0, 0> is established. Accordingly, data D1 on data bus line pair DB01, ZDB01 is output as the first data. Data D0 on data bus pair DB00, ZDB00 is output as the second data. Data D3 on data bus pair DB11, ZDB11 output as the third data. Data D2 on data bus pair DB10, ZDB10 is output as the fourth data. Thus, the data is output in the order of D1→D0→D3→D2.

When <CA1, CA0>=<1, 0>, <EZORG1, EZORG0>=<0, 1> is established. Here, <S00, S01, S10, S11>=<0, 0, 1, 0> is established. Accordingly, data D2 on data bus line pair DB10, ZDB10 is output as the first data. Data D3 on data bus pair DB11, ZDB11 is output as the second data. Data D0 on data bus pair DB00, ZDB00 is output as the third data. Data D1 on data bus pair DB01, ZDB01 is output as the fourth data. Thus, the data is output in the order of D2→D3→D0→D1.

When <CA1, CA0>=<1, 1>, <EZORG1, EZORG0>=<1, 1> is established. Here, <S00, S01, S10, S11>=<0, 0, 0, 1> is established. Accordingly, data D3 on data bus line pair DB11, ZDB11 is output as the first data. Data D2 on data bus pair DB10, ZDB10 is output as the second data. Data D1 on data bus pair DB01, ZDB01 is output as the third data. Data D0 on data bus pair DB00, ZDB00 is output as the fourth data. Thus, the data is output in the order of D3→D2→D1→D0.

(Output Circuit of Present Embodiment)

Figure 7:
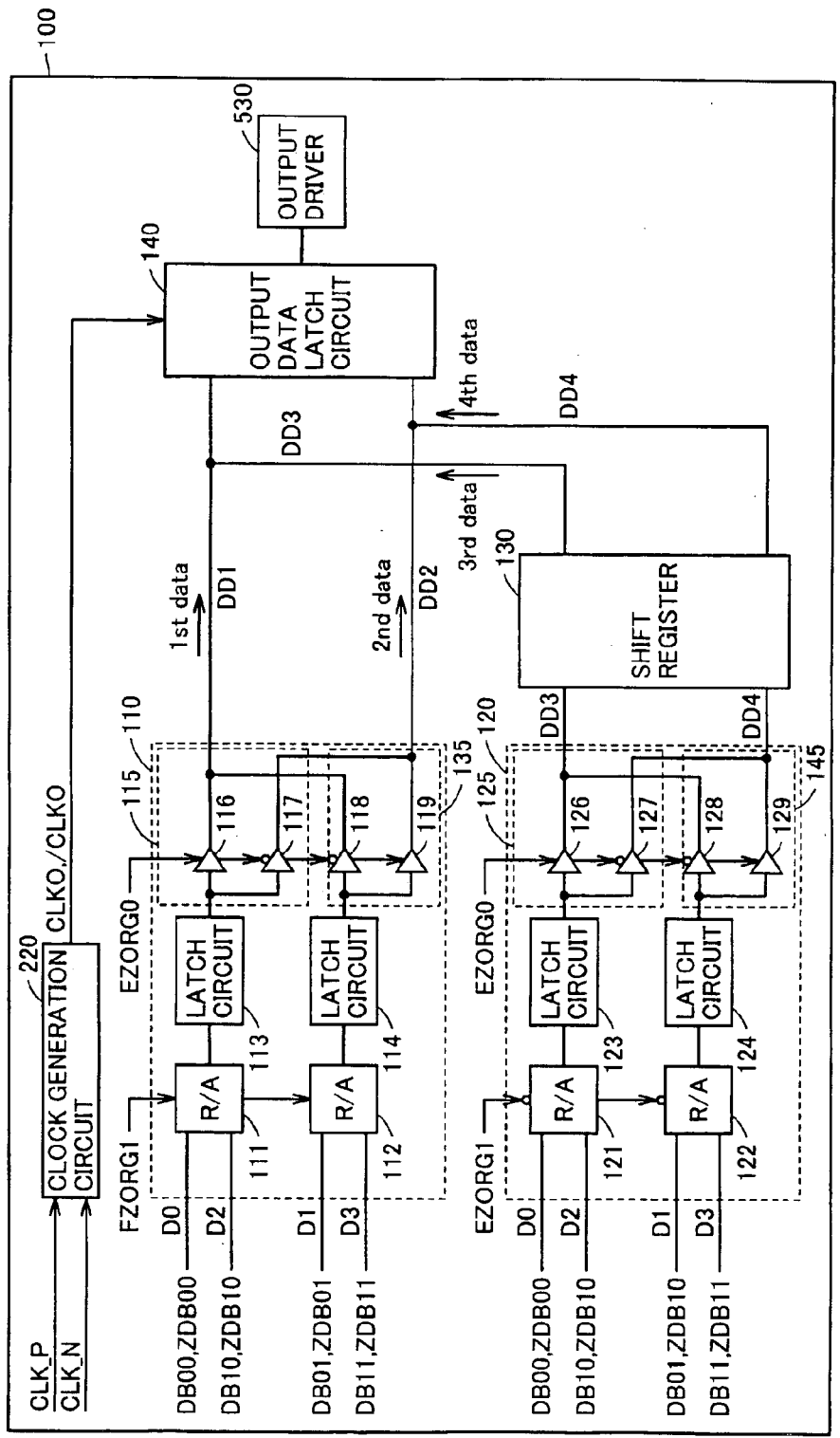
FIG. 7 shows a structure of an output circuit according to an embodiment of the present invention.

Output circuit 100 shown in FIG. 7 includes a clock generation circuit 220, an output data latch circuit 140, and an output driver 530.

Output circuit 100 further includes an amplify & select circuit 110, an amplify & select circuit 120, and a shift register 130.

Clock generation circuit 220, output data latch circuit 140 and output driver 530 are similar to those included in conventional output circuit 101 described above. Therefore, description thereof will not be repeated.

Amplifier & select circuit 110 includes amplifier circuits (R/A) 111 and 112, latch circuits 113 and 114, and switch circuits 115 and 135.

Figure 8A:
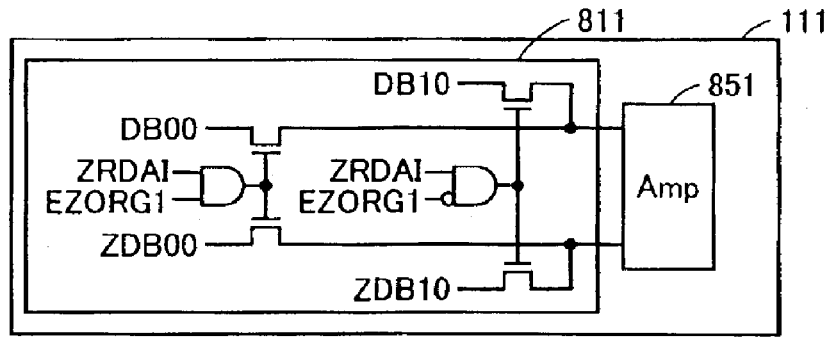
FIGS. 8A, 8B, 8C and 8D show a structure of an amplifier circuit (R/A) 111, an amplifier circuit (R/A) 112, an amplifier circuit (R/A) 121, and an amplifier circuit (R/A) 122, respectively.

Amplifier circuit (R/A) 111 shown in FIG. 8A is formed of a switch circuit 811 and an amplifier 851.

Switch circuit 811 is connected to data bus pair DB00, ZDB00 and data bus pair DB10, ZDB10 to which data of memory cells in the column specified by column addresses with a different value for CA1 and the same value for CA0 are output.

At switch circuit 811, data D0 of data bus pair DB00, ZDB00 and data D2 of data bus pair DB10, ZDB10 are applied to amplifier 851 when EZORG1=1 and EZORG1=0, respectively, in response to activation of signal ZRDAI.

Amplifier 851 provides to latch circuit 113 the amplified data D0 or D2.

Latch circuit 113 retains amplified data D0 or D2.

Figure 8B:
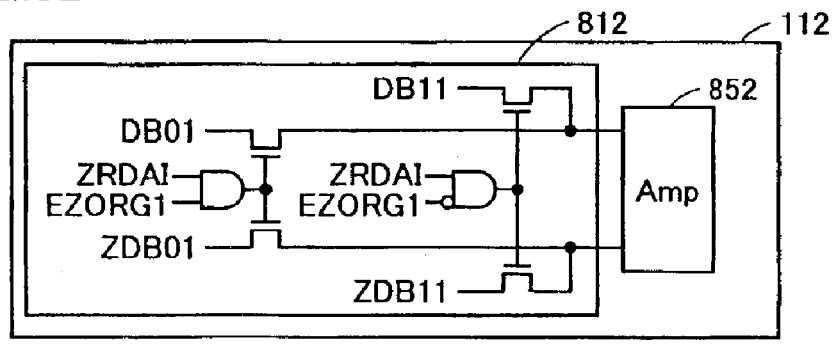

Amplifier circuit (R/A) 112 of FIG. 8B is formed of a switch circuit 812 and an amplifier 852.

Switch circuit 812 is connected to data bus pair DB01, ZDB01 and data bus pair DB11, ZB11 to which data of memory cells in a column specified by column addresses with a different value for CA1 and the same value (=1) for CA0 are output.

At switch circuit 812, data D1 of data bus pair DB01, ZDB01 and data D3 of data bus pair DB11, ZDB11 are applied to amplifier 852 when EZORG1=1 and EZORG1=0, respectively, in response to activation of signal ZRDAI.

Amplifier 852 provides to latch circuit 114 the amplified data D1 or D3.

Latch circuit 114 retains amplified data D1 or D3.

Switch circuit 115 includes selectors 116 and 117.

When control signal EZORG0=1, selector 116 provides data D0 or D2 output from latch circuit 113 onto data line DD1 as the first data. When control signal EZORG0=0, data D0 or D2 from latch circuit 113 is not output. When the inverted signal of control signal EZORG0 is 1, selector 117 provides data D0 or D2 output from latch circuit 113 onto data line DD2 as the second data. When the inverted signal of control signal EZORG0 is 0, data D0 or D2 from latch circuit 113 is not output.

Switch circuit 135 includes selectors 118 and 119.

When the inverted signal of control signal EZORG0 is 1, selector 118 provides data D1 or D3 output from latch circuit 114 onto data line DD1 as the first data. When the inverted signal of control signal EZORG0 is 0, data D1 or D3 from latch circuit 114 is not output. When control signal EZORG0=1, selector 119 provides data D1 or D3 output from latch circuit 114 onto data line DD2 as the second data. When control signal EZORG0=0, data D1 or D3 from latch circuit 114 is not output.

Amplify & select circuit 120 includes amplifier circuits (R/A) 121 and 122, latch circuits 123 and 124 and switch circuits 125 and 145.

Figure 8C:
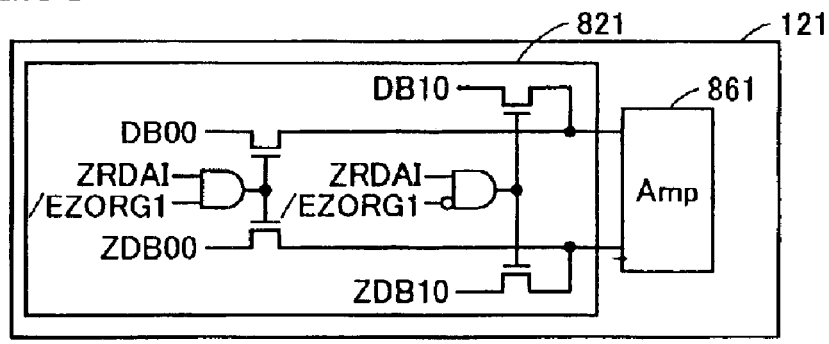

Amplifier circuit (R/A) 121 shown in FIG. 8C is formed of a switch circuit 821 and an amplifier 861.

Switch circuit 821 is connected to data bus pairs identical to those connected to amplifier circuit 111.

At switch circuit 821, data D0 of data bus pair DB00, ZDB00 and data D2 of data bus pair DB10, ZDB10 are applied to amplifier 861 when /EZORG1=1 and 0 (therefore, EZORG1=0 and 1), respectively, in response to activation of signal ZRDAI.

Amplifier 861 provides to latch circuit 123 the amplified data D0 or D2.

Latch circuit 123 retains amplified data D0 or D2.

Figure 8D:
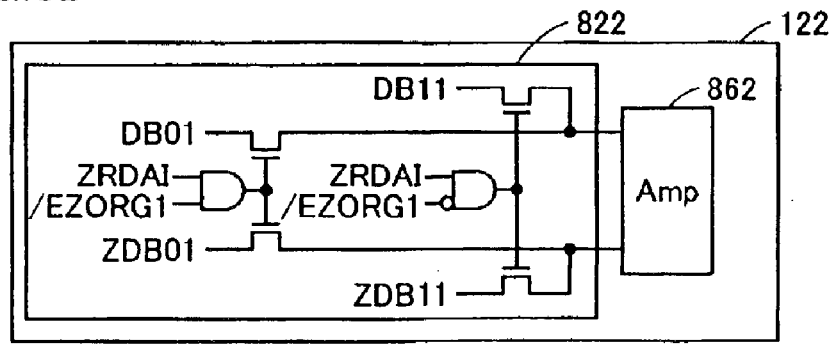

Amplifier circuit (R/A) 122 shown in FIG. 8D is formed of a switch circuit 822 and an amplifier 862.

Switch circuit 822 is connected to data bus pairs identical to those connected to amplifier circuit 112.

At switch circuit 822, data D1 of data bus pair DB01, ZDB01 and data D3 of data bus pair DB11, ZDB11 are applied to amplifier 862 when /EZORG1=1 and 0 (i.e., EZORG1=0 and 1), respectively, in response to activation of signal ZRDAI.

Amplifier 862 provides to latch circuit 124 the amplified data D1 or D3.

Latch circuit 124 retains amplified data D1 or D3.

Switch circuit 125 includes selectors 126 and 127.

When control signal EZORG0=1, selector 126 provides data D0 or D2 output from latch circuit 123 onto data line DD3 as the third data. When control signal EZORG0=0, data D0 or D2 from latch circuit 123 is not output. When the inverted signal of control signal EZORG0 is 1, selector 127 provides data D0 or D2 output from latch circuit 123 onto data line DD4 as the fourth data. When the inverted signal of control signal EZORG0 is 0, data D0 or D2 from latch circuit 123 is not output.

Switch circuit 145 includes selectors 128 and 129.

When the inverted signal of control signal EZORG0 is 1, selector 128 provides data D1 or D3 output from latch circuit 124 onto data line DD3 as the third data. When the inverted signal of control signal EZORG0 is 0, data D1 or D3 from latch circuit 124 is not output. When control signal EZORG0=1, selector 129 provides data D1 or D3 output from latch circuit 124 onto data line DD4 as the fourth data. When control signal EZORG0=0, data D1 or D3 from latch circuit 124 is not output.

Shift register 130 is provided during the passage of data lines DD3 and DD4 to retain the third data and the fourth data, which are output at an elapse of one cycle.

Output data latch circuit 140 is triggered by the rise of a signal CLK0 at every half cycle to fetch and provide to output driver 530 the first data, the second data, the third data or the fourth data.

Accordingly, when <CA1, CA0>=<0, 0>, <EZORG1, EZORG0>=<1, 1> is established. Therefore, amplifier circuit 111 outputs data D0 whereas amplifier circuit 112 outputs data D1. Switch circuit 115 outputs data D0 from latch circuit 113 onto data line DD1. Switch circuit 135 outputs data D1 from latch circuit 114 onto data line DD2. Amplifier circuit 121 outputs data D2 whereas amplifier circuit 122 outputs data D3. Switch circuit 125 outputs data D2 from latch circuit 113 onto data line DD3. Switch circuit 145 outputs data D3 from latch circuit 114 to data line DD4. Therefore, data is output in the order of D0→D1→D2→D3.

When <CA1, CA0>=<0, 1>, <EZORG1, EZORG0>=<1, 0> is established. Therefore, amplifier circuit 111 outputs data D0 whereas amplifier circuit 112 outputs data D1. Switch circuit 115 outputs data D0 from latch circuit 113 onto data line DD2. Switch circuit 135 outputs data D1 from latch circuit 114 onto data line DD1. Amplifier circuit 121 outputs data D2 whereas amplifier circuit 122 outputs data D3. Switch circuit 125 outputs data D2 from latch circuit 123 onto data line DD4. Switch circuit 145 outputs data D1 from latch circuit 124 onto data line DD3. Therefore, data is output in the order of D1→D0→D3→D2.

When <CA1, CA0>=<1, 0>, <EZORG1, EZORG0>=<0, 1> is established. Therefore, amplifier circuit 111 outputs data D2 whereas amplifier circuit 112 outputs data D3. Switch circuit 115 outputs data D2 from latch circuit 113 onto data line DD1. Switch circuit 135 outputs data D3 from latch circuit 114 onto data line DD2. Amplifier circuit 121 outputs data D0 whereas amplifier circuit 122 outputs data D1. Switch circuit 125 outputs data D0 from latch circuit 123 onto data line DD3. Switch circuit 145 outputs data D1 from latch circuit 114 to data line DD4. Therefore, data is output in the order of D2→D3→D0→D1.

When <CA1, CA0>=<1, 1>, <EZORG1, EZORG0>=<0, 0> is established. Therefore, amplifier circuit 111 outputs data D2 whereas amplifier circuit 112 outputs data D3. Switch circuit 115 outputs data D2 from latch circuit 113 onto data line DD2. Switch circuit 135 outputs data D3 from latch circuit 114 onto data line DD1. Amplifier circuit 121 outputs data D0 whereas amplifier circuit 122 outputs data D1. Switch circuit 125 outputs data D0 from latch circuit 123 onto data line DD4. Switch circuit 145 outputs data D1 from latch circuit 124 to data line DD3. Therefore, data is output in the order of D3→D2→D1→D0.

Complexity of Output Circuit

Comparison between conventional output circuit 101 and output circuit 100 of the present embodiment will be provided hereinafter based on the complexity and speed of P/S conversion.

Conventional output circuit 101 (per 1 DQ terminal) requires 16 selectors whereas output circuit 100 (per 1 DQ terminal) of the present embodiment requires 8 selectors. Therefore, the number of selectors in output circuit 100 of the present embodiment is half that of conventional output circuit 101. Since a selector among the various components forming an output circuit is great in size, the layout area (i.e. circuit complexity) of output circuit 100 of the present embodiment will become smaller than the layout area (i.e., circuit complexity) of conventional output circuit 101.

In conventional output circuit 101, two N channel MOS transistors are required for one amplifier circuit (R/A). In output circuit 100 of the present embodiment, four N channel MOS transistors and two AND circuits are required for one amplifier circuit (R/A). Since the size of an amplifier circuit is extremely smaller than that of a selector, increase of the number of MOS transistors in the amplifier circuit as in the present embodiment substantially has no influence on the layout area of the output circuit.

P/S Conversion Rate of Output Circuit

In conventional output circuit 101, each one of latch circuits 42, 52, 62 and 72 is connected to four selectors. In output circuit 100 of the present embodiment, each one of latch circuits 113, 114, 123 and 124 is connected to two selectors. Since a selector has a large size, increase in the number of selectors connected to one latch circuit is disadvantageous in that the selectors must be arranged with a longer wiring for connection between the latch circuit and respective selectors. This means that the wiring length between a latch circuit and a selector in output circuit 100 of the present embodiment is shorter than that in conventional output circuit 101. Therefore, data can be subjected to P/S conversion for output to a bit line pair faster than by conventional output circuit 101.

Conventionally, one input node of an amplifier in amplifier circuit (R/A) is connected to one MOS transistor. In the present embodiment, one input node in an amplifier (Amp) in the amplifier circuit (R/A) is connected to two MOS transistors. Although an amplifier will exhibit increase in the parasitic capacitance in proportion to the increase in the number of connected MOS transistors to result in a longer period of time to charge an input node, this increase in time is so small that it can be neglected.

Operation

Figure 9:
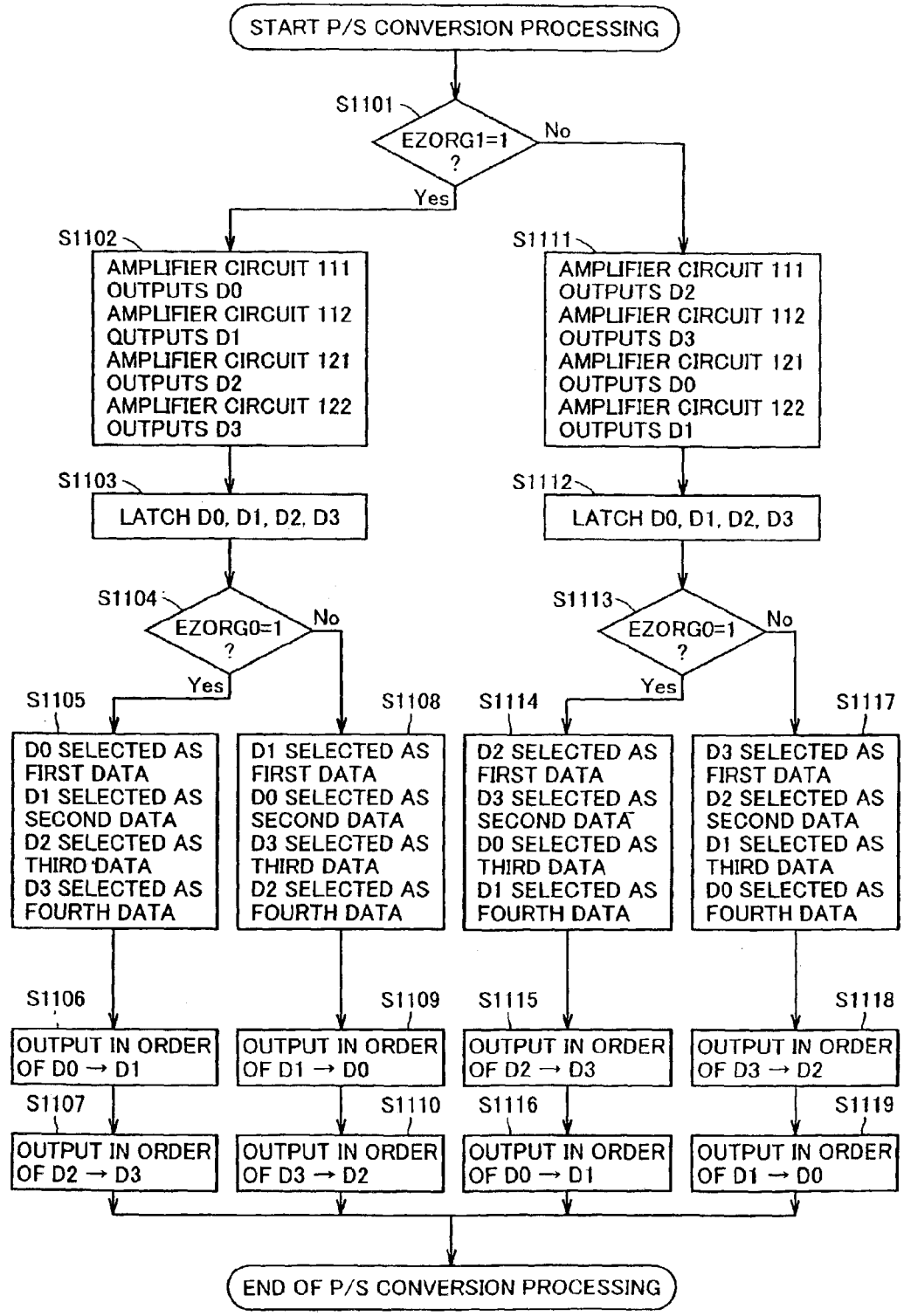
FIG. 9 is a flow chart of the P/S conversion procedure of an output circuit 100 according to an embodiment of the present invention.

The operation of P/S conversion of output circuit 100 according to the present embodiment will be described hereinafter with reference to the flow chart of FIG. 9.

First, amplifier circuits 111, 112, 121 and 122 effect the first stage of ordering through respective included switch circuits. The switch circuit included in these amplifier circuits outputs towards a subsequent stage of switch circuit 115 or 135 the first or second data that are to be output to an external source at the former stage, and outputs towards a subsequent stage of switch circuit 125 or 145 the third or fourth data output to an external source at the latter stage.

When EZORG1=1 (step S1101), amplifier circuit 111 amplifies and outputs data D0 of data bus pair DB00, ZDB00. Amplifier circuit 112 amplifies and outputs data D1 of data bus pair DB01, ZDB01. Amplifier circuit 121 amplifies and outputs data D2 of data bus pair DB10, ZDB10. Amplifier circuit 122 amplifies and outputs data D3 of data bus pair DB11, ZDB11 (step S1102).

Then, latch circuit 113 latches data D0. Latch circuit 114 latches data D1. Latch circuit 123 latches data D2. Latch circuit 124 latches data D3 (step S1103).

Switch circuits 115, 135, 125 and 145 effect the second stage of ordering. Specifically, when EZORG0=1 (step S1104), switch circuit 115 selects and outputs onto data line DD1 data D0 as the first data. Switch circuit 135 selects and outputs onto data line DD2 data D1 as the second data. Switch circuit 125 selects and outputs onto data line DD3 data D2 as the third data. Switch circuit 145 selects and outputs onto data line DD4 data D3 as the fourth data (step S1105).

Output data latch circuit 140 is triggered by a rise of signal CLKO to fetch data D0, and is triggered by the next rise of signal CLKO to fetch data D1. These data D0 and D1 are output from data input/output terminal 518 via output driver 530 (step S1106).

As to data D2 and D3 retained in shift register 130, data D2 is output through data line DD3 and data D3 is output through data line DD4 at an elapse of 1 cycle. Output data latch circuit 140 is triggered by a rise of clock signal CLKO to fetch data D2 and is triggered by the next rise of signal CLKO to fetch data D3. Fetched data D2 and D3 are output from data input/output terminal 518 via output driver 530 (step S1107).

When EZORG0=0 (step S1104), switch circuit 135 selects and outputs onto data line DD1 data D1 as the first data. Switch circuit 115 selects and outputs onto data line DD2 data D0 as the second data. Switch circuit 145 selects and outputs onto data line DD3 data D3 as the third data. Switch circuit 125 selects and outputs onto data line DD4 data D2 as the fourth data (step S1108).

Output data latch circuit 140 is triggered by a rise of signal CLKO to fetch data D1, and is triggered by the next rise of signal CLKO to fetch data D0. These data D1 and D0 are output from data input/output terminal 518 via output driver 530 (step S1109).

As to data D3 and D2 retained in shift register 130, data D3 is output through data line DD3 and data D2 is output through data line DD4 at an elapse of one cycle. Output data latch 140 is triggered by a rise of signal CLKO to fetch data D3, and is triggered by the next rise of signal CLKO to fetch data D2. These data D3 and D2 are output from data input/output terminal 518 via output driver 530 (step S1110).

When EZORG1=0 (step S1101), amplifier circuit 111 amplifies and outputs data D2 of data bus pair DB10, ZDB10. Amplifier circuit 112 amplifies and outputs data D3 of data bus pair DB11, ZDB11. Amplifier circuit 121 amplifies and outputs data D0 of data bus pair DB00, ZDB00. Amplifier circuit 122 amplifies and outputs data D1 of data bus pair DB01, ZDB01 (step S1111).

Then, latch circuit 113 latches data D2. Latch circuit 114 latches data D3. Latch circuit 123 latches data D0. Latch circuit 124 latches data D1 (step S1112).

Switch circuits 115, 135, 125 and 145 effect the second stage ordering.

Specifically, when EZORG0=1 (step S1113), switch circuit 115 selects and outputs onto data line DD1 data D2 as the first data. Switch circuit 135 selects and outputs onto data line DD2 data D3 as the second data. Switch circuit 125 selects and outputs to data line DD3 data D0 as the third data. Switch circuit 145 selects and outputs onto data line DD4 (step S1105) data D1 as the fourth data (step S1114).

Output data latch circuit 140 is triggered by a rise of signal CLKO to fetch data D2, and is triggered by the next rise of signal CLKO to fetch data D3. These data D2 and D3 are output from data input/output terminal 518 via output driver 530 (step S1115).

As to data D0 and D1 retained in shift register 130, data D0 is output through data line DD3 and data D1 is output through data DD4 at an elapse of 1 cycle. Output data latch circuit 140 is triggered by a rise of clock signal CLKO to fetch data D0 and is triggered by the next rise of signal CLKO to fetch data D1. Fetched data D0 and D1 are output from data input/output terminal 518 via output driver 530 (step S1116).

When EZORG0=0 (S1113), switch circuit 135 selects and outputs onto data line DD1 data D3 as the first data. Switch circuit 115 selects and outputs onto data line DD2 data D2 as the second data. Switch circuit 145 selects and outputs onto data line DD3 data D1 as the third data. Switch circuit 125 selects and outputs onto data line DD4 data D0 as the fourth data (step S1117).

Output data latch circuit 140 is triggered by a rise of signal CLKO to fetch data D3, and is triggered by the next rise of signal CLKO to fetch data D2. These data D3 and D2 are output from data input/output terminal 518 via output driver 530 (step S1118).

As to data D1 and D0 retained in shift register 130, data D1 is output through data line DD3 and data D0 is output through data line DD4 at an elapse of one cycle. Output data latch 140 is triggered by a rise of signal CLKO to fetch data D1, and is triggered by the next rise of signal CLKO to fetch data D0. These data D1 and D0 are output from data input/output terminal 518 via output driver 530 (step S1119).

The output circuit of the semiconductor memory device of the present embodiment carries out P/S conversion in two stages with respect to prefetched data. Therefore, the number of selectors can be reduced than in the case where P/S conversion is carried out in one stage. Furthermore, the wiring length connecting the selector and a latch circuit in the output circuit can be reduced. Thus, the semiconductor memory device of the present invention is of low complexity, and can carry out P/S conversion of prefetched data at high speed.

Second Embodiment

The second embodiment is directed to an 8-bit prefetch scheme. In the 8-bit prefetch scheme, data of 8 memory cells specified by column addresses all having common upper bits but the least significant 3 bits corresponding to column address CA generated at address buffer 526 are read out in parallel. Here, the least significant bit of column address CA is defined "CA0", the next upper bit to the least significant bit is defined "CA1", and the next upper bit thereto is defined "CA2".

Figure 10:
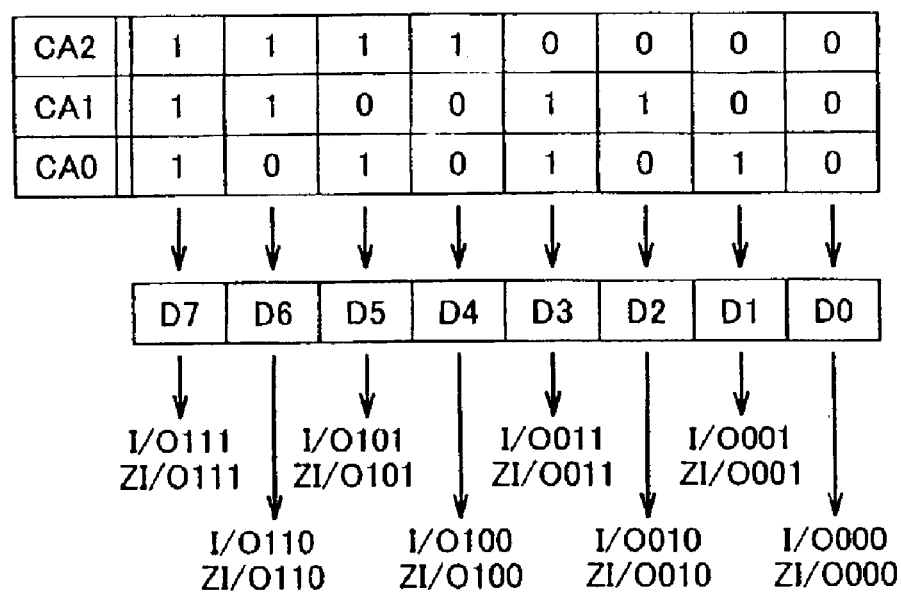
FIG. 10 shows the corresponding relationship between a memory cell and an I/O line pair to which the data in the relevant memory cell is output.

FIG. 10 shows the corresponding relationship between a memory cell and an I/O line pair to which data in a memory cell is output. Referring to FIG. 10, data D0 of the memory cell in the column specified by CA2=0, CA1=0, and CA0=0 is output onto I/O line pair I/O000, ZI/O000. Data D1 of the memory cell in the column specified by CA2=0, CA1=0, and CA0=1 is output onto I/O line pair I/O001, ZI/O001. Data D2 of the memory cell in a column specified by CA2=0, CA1=1, and CA0=0 is output onto I/O line pair I/O010, ZI/O010. Data D3 of the memory cell in a column specified by CA2=0, CA1=1, and CA0=1 is output onto I/O line pair I/O011, ZI/O011. Data D4 of the memory cell in the column specified by CA2=1, CA1=0, and CA0=0 is output onto I/O line pair I/O100, ZI/O100. Data D5 of the memory cell in the column specified by CA2=1, CA1=0, and CA0=1 is output onto I/O line pair I/O101, ZI/O101. Data D6 of the memory cell in the column specified by CA2=1, CA1=1, and CA0=0 is output onto I/O line pair I/O110, ZI/O110. Data D7 in the memory cell of the column specified by CA2=1, CA1=1, and CA0=1 is output onto I/O line pair I/O111, ZI/O111.

As to the eight data read out in parallel, the first stage ordering is effected at read circuit 700, and the second stage and third stage ordering as described in the previous first embodiment are effected at output circuit 100 in the present embodiment.

FIG. 11 shows the relationship between the least significant 3 bits, i.e. CA2, CA1 and CA0, of externally applied column address CA, and the output sequence of the eight data.

When the externally applied column address exhibits CA2=0, CA1=0, and CA0=0, data are output in the order of D0 (specified by CA2=0, CA1=0, and CA0=0)→D1 (specified by CA2=0, CA1=0, and CA0=1)→D2 (specified by CA2=0, CA1=1, and CA0=0)→D3 (specified by CA2=0, CA1=1, and CA0=1)→D4 (specified by CA2=1, CA1=0, and CA0=0)→D5 (specified by CA2=1, CA1=0, and CA0=1)→D6 (specified by CA2=1, CA1=1, and CA0=0) →D7 (specified by CA2=1, CA1=1, and CA0=1).

When the externally applied column address exhibits CA2=0, CA1=0, and CA0=1, data are output in the order of D1 (specified by CA2=0, CA1=0, and CA0=1)→D0 (specified by CA2=0, CA1=0, and CA0=0)→D3 (specified by CA2=0, CA1=1, and CA0=1)→D2 (specified by CA2=0, CA1=1, and CA0=0)→D5 (specified by CA2=1, CA1=0, and CA0=1)→D4 (specified by CA2=1, CA1=0, and CA0=0)→D7 (specified by CA2=1, CA1=1, and CA0=1) →D6 (specified by CA2=1, CA1=1, and CA0=0).

When the externally applied column address exhibits CA2=0, CA1=1, and CA0=0, data are output in the order of D2 (specified by CA2=0, CA1=1, and CA0=0)→D3 (specified by CA2=0, CA1=1, and CA0=1)→D0 (specified by CA2=0, CA1=0, and CA0=0)→D1 (specified by CA2=0, CA1=0, and CA0=1)→D6 (specified by CA2=1, CA1=1, and CA0=0)→D7 (specified by CA2=1, CA1=1, and CA0=1)→D4 (specified by CA2=1, CA1=0, and CA0=0) →D5 (specified by CA2=1, CA1=0, and CA0=1).

When the externally applied column address exhibits CA2=0, CA1=1, and CA0=1, data are output in the order of D3 (specified by CA2=0, CA1=1, and CA0=1)→D2 (specified by CA2=0, CA1=1, and CA0=0)→D1 (specified by CA2=0, CA1=0, and CA0=1)→D0 (specified by CA2=0, CA1=0, and CA0=0)→D7 (specified by CA2=1, CA1=1, and CA0=1)→D6 (specified by CA2=1, CA1=1, and CA0=0)→D5 (specified by CA2=1, CA1=0, and CA0=1) →D4 (specified by CA2=1, CA1=0, and CA0=0).

When the externally applied column address exhibits CA2=1, CA1=0, and CA0=0, data are output in the order of D4 (specified by CA2=1, CA1=0, and CA0=0)→D5 (specified by CA2=1, CA1=0, and CA0=1)→D6 (specified by CA2=1, CA1=1, and CA0=0)→D7 (specified by CA2=1, CA1=1, and CA0=1)→D0 (specified by CA2=0, CA1=0, and CA0=0)→D1 (specified by CA2=0, CA1=0, and CA0=1)→D2 (specified by CA2=0, CA1=1, and CA0=0) →D3 (specified by CA2=0, CA1=1, and CA0=1).

When the externally applied column address exhibits CA2=1, CA1=0, and CA0=1, data are output in the order of D5 (specified by CA2=1, CA1=0, and CA0=1)→D4 (specified by CA2=1, CA1=0, and CA0=0)→D7 (specified by CA2=1, CA1=1, and CA0=1)→D6 (specified by CA2=1, CA1=1, and CA0=0)→D1 (specified by CA2=0, CA1=0, and CA0=1)→D0 (specified by CA2=0, CA1=0, and CA0=0)→D3 (specified by CA2=0, CA1=1, and CA0=1) →D2 (specified by CA2=0, CA1=1, and CA0=0).

When the externally applied column address exhibits CA2=1, CA1=1, and CA0=0, data are output in the order of D6 (specified by CA2=1, CA1=1, and CA0=0)→D7 (specified by CA2=1, CA1=1, and CA0=1)→D4 (specified by CA2=1, CA1=0, and CA0=0)→D5 (specified by CA2=1, CA1=0, and CA0=1)→D2 (specified by CA2=0, CA1=1, and CA0=0)→D3 (specified by CA2=0, CA1=1, and CA0=1)→D0 (specified by CA2=0, CA1=0, and CA0=0) →D1 (specified by CA2=0, CA1=0, and CA0=1).

When the externally applied column address exhibits CA2=1, CA1=1, and CA0=1, data are output in the order of D7 (specified by CA2=1, CA1=1, and CA0=1)→D6 (specified by CA2=1, CA1=1, and CA0=0)→D5 (specified by CA2=1, CA1=0, and CA0=1)→D4 (specified by CA2=1, CA1=0, and CA0=0)→D3 (specified by CA2=0, CA1=1, and CA0=1)→D2 (specified by CA2=0, CA1=1, and CA0=0)→D1 (specified by CA2=0, CA1=0, and CA0=1) →D0 (specified by CA2=0, CA1=0, and CA0=0).

Thus, the data of a memory cell in the column specified by externally applied column address CA is first output. The four memory cells from which data are output at the first half have the same value for specified column address CA2, and the four memory cells from which data are output at the last half have the same value for column address CA2. Attention is now focused on the four memory cells from which data are output at the first half. The first two of these four memory cells from which data are output at the first half have the same value for column address CA1 whereas the latter two of these four memory cells have the same value for column address CA1. Similarly, attention is focused on the four memory cells from which data are output at the last half. The first two of these four memory cells from which former data are output have the same value for column address CA1 whereas the two of these memory cells from which latter data are output have the same value for column address CA1.

Figure 12:
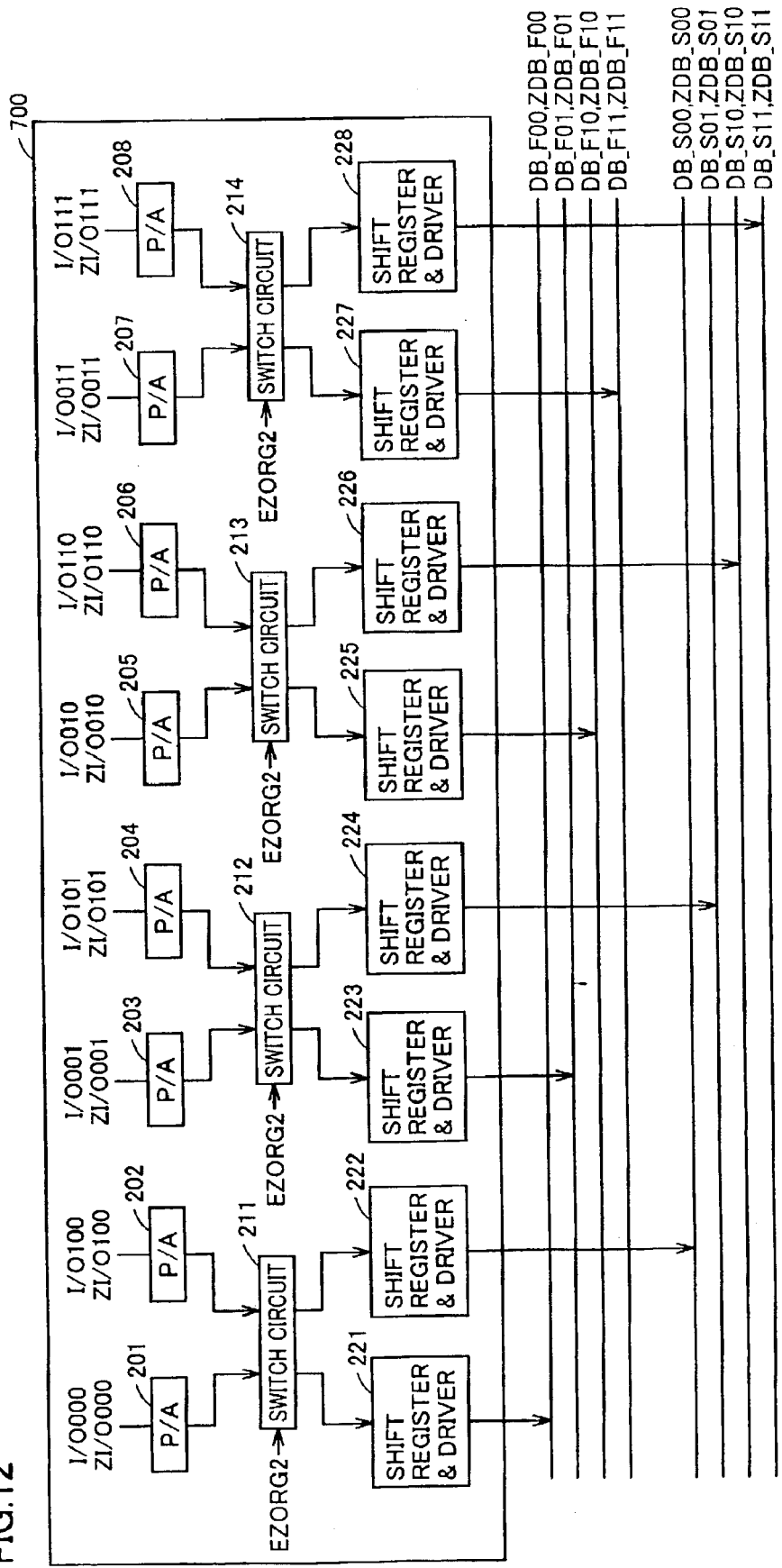
FIG. 12 shows a structure of a read circuit (per 1 DQ terminal) according to an embodiment of the present invention.

Referring to FIG. 12, read circuit (per 1 DQ terminal) 700 of the second embodiment includes eight preamplifiers 201–208, four switch circuits 211–214, and eight shift register & drivers 221–228. The eight data bus pairs connected to read circuit 700 are divided into two groups. The data transmitted through data bus pairs of the first group DB_FXX, ZDB_FXX (X=00, 01, 10, 11) are output prior to the output of the data transmitted through data bus pairs of the second group DB_SXX, ZDB_SXX (X=00, 01, 10, 11).

Preamplifiers 201–208 amplify data from respective corresponding I/O line pairs.

Figure 13A:
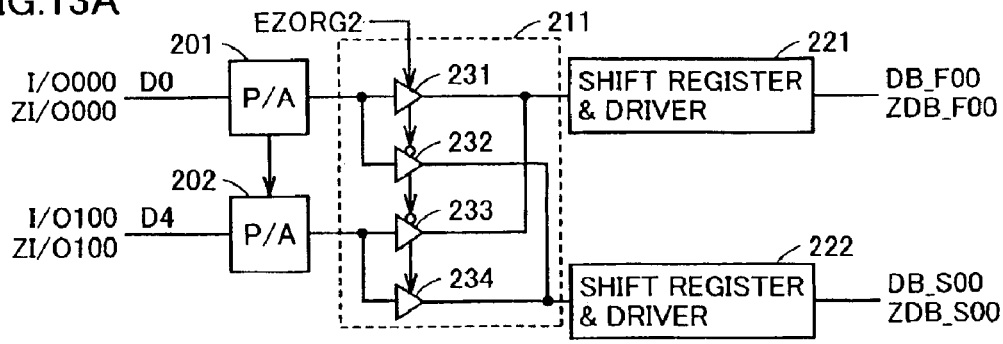
FIGS. 13A, 13B, 13C and 13D show a structure of a switch circuit 211, a switch circuit 212, a switch circuit 213, and a switch circuit 214, respectively.

FIG. 13A shows a structure of switch circuit 211.

Switch circuit 211 is connected to I/O line pair I/O000, SZDB000 and I/O line pair DB100, ZDB100 to which are output data of memory cells in the column specified by column addresses having a different value for CA2 and the same values for CA1 and CA0 (CA1=0, CA0=0).

Switch circuit 211 includes four selectors to receive control signal EZORG2 from control circuit 542. EZORG2 is set to 1 and 0 when CA2=0 and CA2=1, respectively, by control circuit 542.

When control signal EZORG2=1, selector 231 selects data D0 output from preamplifier 201 as the first half data onto data bus pair DB_F00, ZDB_F00 via shift register & driver 221. When control signal EZORG2=0, data D0 from preamplifier 201 is not output.

When control signal EZORG2=0, selector 232 selects data D0 output from preamplifier 201 as the second half data onto data bus pair DB_S00, ZDB_S00 via shift register & driver 222. When control signal EZORG2=1, data D0 from preamplifier 201 is not output.

When control signal EZORG2=0, selector 233 selects data D4 output from preamplifier 202 as the first half data onto data bus pair DB_F00, ZDB_F00 via shift register & driver 221. When control signal EZORG2=1, data D4 from preamplifier 202 is not output.

When control signal EZORG2=1, selector 234 selects data D4 output from preamplifier 202 as the second half data onto data bus pair DB_S00, ZDB_S00 via shift register & driver 222. When control signal EZORG2=0, data D4 from preamplifier 202 is not output.

Figure 13B:
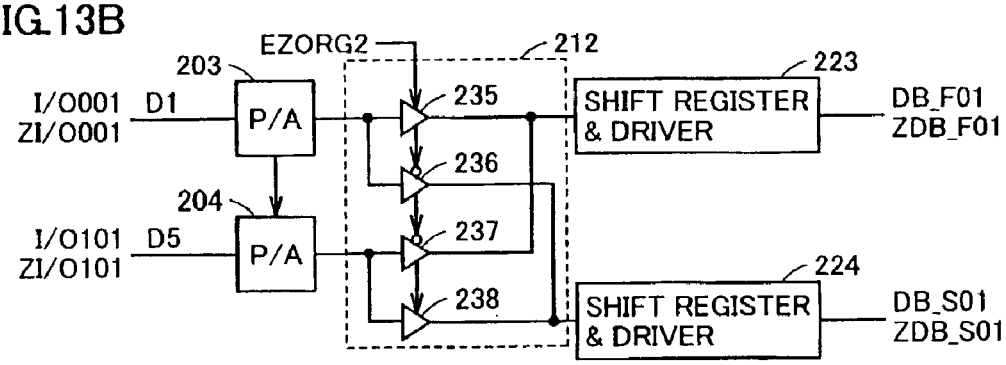

FIG. 13B shows a structure of switch circuit 212.

Switch circuit 211 is connected to I/O line pair I/O001, SZDB001 and I/O line pair DB001, ZDB001 to which are output data of memory cells in the column specified by column addresses having a different value for CA2 and the same values for CA1 and CA0 (CA1=0, CA0=1).

Switch circuit 212 includes four selectors to receive control signal EZORG2 from control circuit 542. EZORG2 is set to 1 and 0 when CA2=0 and CA2=1, respectively, by control circuit 542.

When control signal EZORG2=1, selector 235 selects data D01 output from preamplifier 203 as the first half data onto data bus pair DB_F01, ZDB_F01 via shift register & driver 223. When control signal EZORG2=0, data D1 from preamplifier 203 is not output.

When control signal EZORG2=0, selector 236 selects data D1 output from preamplifier 203 as the second half data onto data bus pair DB_S01, ZDB_S01 via shift register & driver 224. When control signal EZORG2=1, data D1 from preamplifier 203 is not output.

When control signal EZORG2=0, selector 237 selects data D5 output from preamplifier 204 as the first half data onto data bus pair DB_F00, ZDB_F00 via shift register & driver 223. When control signal EZORG2=1, data D5 from preamplifier 204 is not output.

When control signal EZORG2=1, selector 238 selects data D5 output from preamplifier 204 as the second half data onto data bus pair DB_S01, ZDB_S01 via shift register & driver 224. When control signal EZORG2=0, data D5 from preamplifier 204 is not output.

Figure 13C:
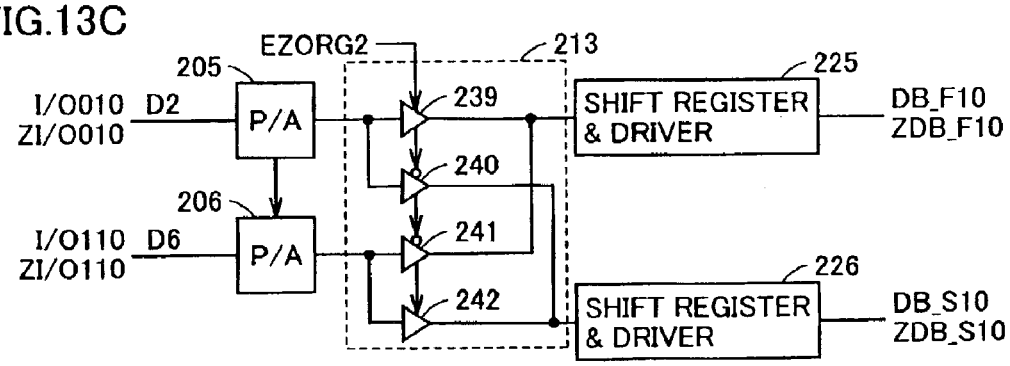

FIG. 13C shows a structure of switch circuit 213.

Switch circuit 213 is connected to I/O line pair I/O010, SZDB010 and I/O line pair DB110, ZDB110 to which are output data of memory cells in the column specified by column addresses having a different value for CA2 and the same values for CA1 and CA0 (CA1=1, CA0=0).

Switch circuit 213 includes four selectors to receive control signal EZORG2 from control circuit 542. EZORG2 is set to 1 and 0 when CA2=0 and CA2=1, respectively, by control circuit 542.

When control signal EZORG2=1, selector 239 selects data D2 output from preamplifier 205 as the first half data onto data bus pair DB_F10 ZDB_F10 via shift register & driver 225. When control signal EZORG2=0, data D2 from preamplifier 205 is not output.

When control signal EZORG2=0, selector 240 selects data D2 output from preamplifier 205 as the second half data onto data bus pair DB_S10, ZDB_S10 via shift register & driver 226. When control signal EZORG2=1, data D2 from preamplifier 205 is not output.

When control signal EZORG2=0, selector 241 selects data D6 output from preamplifier 206 as the first half data onto data bus pair DB_F10, ZDB_F10 via shift register & driver 225. When control signal EZORG2=1, data D6 from preamplifier 206 is not output.

When control signal EZORG2=1, selector 242 selects data D6 output from preamplifier 206 as the second half data onto data bus pair DB_S10, ZDB_S10 via shift register & driver 226. When control signal EZORG2=0, data D6 from preamplifier 206 is not output.

Figure 13D:
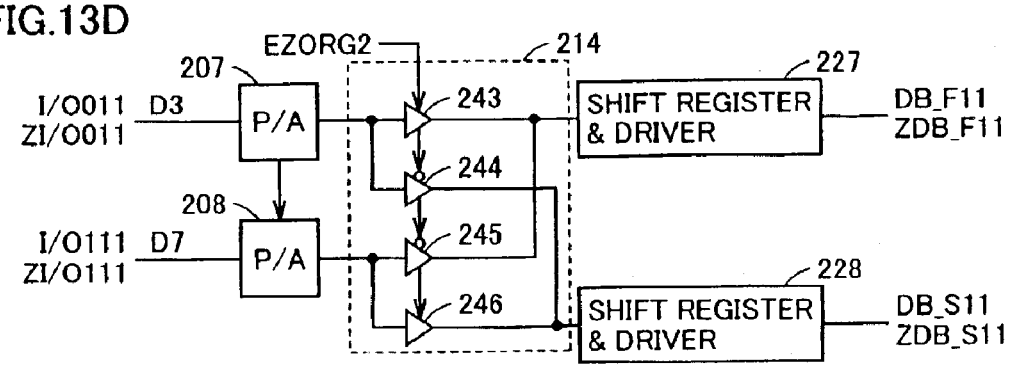

FIG. 13D shows a structure of switch circuit 214.

Switch circuit 214 is connected to I/O line pair I/O011, SZDB011 and I/O line pair DB111, ZDB111 to which are output data of memory cells in the column specified by column addresses having a different value for CA2 and the same values for CA1 and CA0 (CA1=1, CA0=1).

Switch circuit 214 includes four selectors to receive control signal EZORG2 from control circuit 542. EZORG2 is set to 1 and 0 when CA2=0 and CA2=1, respectively, by control circuit 542.

When control signal EZORG2=1, selector 243 selects data D3 output from preamplifier 207 as the first half data onto data bus pair DB_F11, ZDB_F11 via shift register & driver 227. When control signal EZORG2=0, data D3 from preamplifier 207 is not output.

When control signal EZORG2=0, selector 244 selects data D3 output from preamplifier 207 as the second half data onto data bus pair DB_S11, ZDB_S11 via shift register & driver 228. When control signal EZORG2=1, data D3 from preamplifier 207 is not output.

When control signal EZORG2=0, selector 245 selects data D7 output from preamplifier 208 as the first half data onto data bus pair DB_F11, ZDB_F11 via shift register & driver 227. When control signal EZORG2=1, data D7 from preamplifier 208 is not output.

When control signal EZORG2=1, selector 246 selects data D7 output from preamplifier 208 as the second half data onto data bus pair DB_S110, ZDB_S11 via shift register & driver 228. When control signal EZORG2=0, data D7 from preamplifier 208 is not output.

Shift register & drivers 221–228 retain the data from respective-connected switch circuits 211–214 until control signal RDT generated at control circuit 542 attains an H level. In response to control signal RDT going high, the input data is reduced in amplitude to be output onto respective connected data bus pair DB_FXX (XX=00, 01, 10, 11) or DB_SXX (XX=00, 01, 10, 11).

By the above-described read circuit 700, when EZORG2=1, data D0 on I/O line pair I/O000, ZI/O000 is output onto data bus pair DB_F00, ZDB_F00. Data D1 on I/O line pair I/O001, ZI/O001 is output onto data bus line pair DB_F01, ZDB_F01. Data D2 on I/O line pair I/O010, ZI/O010 is output onto data bus pair DB_F10, ZDB_F10. Data D3 on I/O line pair I/O011, ZI/O011, is output into data bus pair DB_F11, ZDB_F11. Data D4 on I/O line pair I/O100, ZI/O100 is output onto data bus pair DB_F00, ZDB_F00. Data D5 on I/O line pair I/O101, ZI/O101 is output onto data bus pair DB_F01, ZDB_F01. Data D6 on I/O line pair I/O110, ZI/O110 is output onto data bus pair DB_F10, ZDB_F10. Data D7 on I/O line pair I/O111, ZI/O111 is output onto data bus pair DB_F11, ZDB_F11.

When EZORG2=0, data D4 on I/O line pair I/O100, ZI/O100 is output onto data bus pair DB_F00, ZDB_F00. Data D5 on I/O line pair I/O111, ZI/O101 is output onto data bus line pair DB_F01 ZDB_F01. Data D6 on I/O line pair I/O110, ZI/O110 is output onto data bus pair DB_F10, ZDB_F10. Data D7 on I/O line pair I/O111, ZI/O111 is output into data bus pair DB_F111 ZDB_F11. Data D0 on I/O line pair I/O000, ZI/O000 is output onto data bus pair DB_S00, ZDB_S00. Data D1 on I/O line pair I/O001, ZI/O001 is output onto data bus pair DB_S01, ZDB_S01. Data D2 on I/O line pair I/O010, ZI/O010 is output onto data bus pair DB_S10, ZDB_S10. Data D3 on I/O line pair I/O011, ZI/O011 is output onto data bus pair DB_S11, ZDB_S11.

Thus, the data of the first group of data bus pairs DB_FXX, ZDB_FXX (XX=00, 01, 10, 11) are first P/S-converted and output by output circuit 100. Then, the data of the second group of data bus pairs DB_SXX, (XX=00, 01, 10, 11) are P/S-converted and output by output circuit 100.

The operation of P/S conversion at read circuit 700 and output circuit 100 of the second embodiment will be described hereinafter with reference to FIG. 14.

Preamplifier 201 amplifies data D0 on I/O line pair I/O000, ZI/O000. Preamplifier 202 amplifies data D4 on I/O line pair I/O100, ZI/O100. Preamplifier 203 amplifies data D1 on I/O line pair I/O001, ZI/O001. Preamplifier 204 amplifies data D5 on I/O line pair I/O101, ZI/O101. Preamplifier 205 amplifies data D2 on I/O line pair I/O010, ZI/O010. Preamplifier 206 amplifies data D6 on I/O line pair I/O110, ZI/O110. Preamplifier 207 amplifies data D3 on I/O line pair I/O011, ZI/O011. Preamplifier 208 amplifies data D8 on I/O line pair I/O111, ZI/O111 (step S1201).

Then, switch circuits 211, 212, 213 and 214 conduct the first stage of P/S conversion. These switch circuits output the first half data of the former half towards data bus pair group DB_FXX, (XX=00, 01, 10, 11), and the second half data of the latter half towards data bus pair group DB_SXX, (XX=00, 01, 10, 11).

When control signal EZORG2=1 (step 1202), switch circuit 211 selects and outputs to shift register & driver 221 data D0 as the first half data, and selects and outputs to shift register & driver 222 data D4 as the second half data. Switch circuit 212 selects and outputs to shift register & driver 223 data D1 as the first half data, and selects and outputs to shift register & driver 224 data D5 as the second half data. Switch circuit 213 selects and outputs to shift register & driver 225 data D2 as the first half data, and selects and outputs to shift register & driver 226 data D6 as the second half data. Switch circuit 214 selects and outputs to shift register & driver 227 data D3 as the first half data, and selects and outputs to shift register & driver 228 data D7 as the second half data (step S1203).

Then, shift register & driver 221 amplifies and outputs onto data bus pair DB_F00 data D0. Shift register & driver 222 amplifies and outputs onto data bus pair DB_S00 data D4. Shift register & driver 223 amplifies and outputs to data bus pair DB_F01 data D1. Shift register & driver 224 amplifies and outputs to data bus pair DB_S01 data D5. Shift register & driver 225 amplifies and outputs onto data bus pair DB_F10 data D2. Shift register & driver 226 amplifies and outputs to data bus pair DB_S10 data D6. Shift register & driver 227 amplifies and outputs onto data bus pair DB_F11 data D3. Shift register & driver 228 amplifies and outputs onto data bus pair DB_S11 data D7 (step S1204).

Next, likewise the first embodiment, the second stage and third stage of P/S conversion are carried out at output circuit 100 on data D0, D1, D2 and D3 output onto the first group of data bus pairs DB_F00, DB_F01, DB_F10, and DB_F11 (step S1205).

Then, the second stage and third stage of P/S conversion are carried out at output circuit 100 on data D4, D5, D6 and D7 output onto the second group of data bus pairs DB_S00, DB_S01, DB_S10, and DB_S11 (step S1206).

When control signal EZORG2=0 (step 1202), switch circuit 211 selects and outputs to shift register & driver 221 data D4 as the first half data, and selects and outputs to shift register & driver 222 data D0 as the second half data. Switch circuit 212 selects and outputs to shift register & driver 223 data D5 as the first half data, and selects and outputs to shift register & driver 224 data D1 as the second half data. Switch circuit 213 selects and outputs to shift register & driver 225 data D6 as the first half data, and selects and outputs to shift register & driver 226 data D2 as the second half data. Switch circuit 214 selects and outputs to shift register & driver 227 data D7 as the first half data, and selects and outputs to shift register & driver 228 data D3 as the second half data (step S1207).

Next, shift register & driver 221 amplifies and outputs onto data bus pair DB_F00 data D4. Shift register & driver 222 amplifies and outputs onto data bus pair DB_S00 data D0. Shift register & driver 223 amplifies and outputs to data bus pair DB_F01 data D5. Shift register & driver 224 amplifies and outputs to data bus pair DB_S01 data D1. Shift register & driver 225 amplifies and outputs onto data bus pair DB_F10 data D6. Shift register & driver 226 amplifies and outputs to data bus pair DB_S10 data D2. Shift register & driver 227 amplifies and outputs onto data bus pair DB_F11 data D7. Shift register & driver 228 amplifies and outputs onto data bus pair DB_S11 data D3 (step S1208).

Likewise the first embodiment, the second stage and third stage of P/S conversion are carried out at output circuit 100 on data D4, D5, D6 and D7 output onto the first group of data bus pairs DB_F00, DB_F01, DB_F10, and DB_F11 (step 1209).

Then, the second stage and third stage of P/S conversion are carried out at output circuit 100 on data D0, D1, D2 and D3 output onto the second group of data bus pairs DB_S00, DB_S01, DB_S10, and DB_S11 (step S1210).

The semiconductor memory device of second embodiment causes the P/S conversion on prefetched data to be carried out also by a read circuit instead of only by an output circuit. As a result, excessive increase of the layout area of the output circuit can be prevented. The entire complexity of the semiconductor memory device can be reduced. Complication of the circuit configuration and increase of the wiring length can be prevented. Thus, P/S conversion can be conducted speedily.

[Modification]

The present invention is not limited to the above-described embodiments, and encompasses modifications set forth below.

(1) In the first embodiment, the switch circuit in an amplifier circuit (R/A) is connected to 2 data bus pairs, and only the data of one of the data bus pairs is provided to the amplifier. It will be understood that such description is merely exemplary, and data of the other data bus pair can be provided to another amplifier as set forth below.

Amplifier circuit 111 is connected to data bus pairs DB00, ZDB00 and DB10, ZDB10, and includes a switch circuit. Amplifier circuit 112 is connected to data bus pairs DB01, ZDB01 and DB11, ZDB11, and includes a switch circuit. Amplifier circuits 121 and 122 are not connected to a data bus pair, do not include a switch circuit, and are formed only of respective amplifiers.

The switch circuit in amplifier circuit 111 provides the data of one of the connected data bus pairs to the amplifier in amplifier circuit 111, and provides the data of the other data bus pair to the amplifier in amplifier circuit 121. The switch circuit in amplifier circuit 112 provides the data of one of the connected data bus pairs to the amplifier in amplifier circuit 112, and provides the data of the other data bus pair to the amplifier in amplifier circuit 122.

(2) The first embodiment was described based on an output circuit that carries P/S conversion in two stages in a 4-bit prefetch scheme. It will be understood that such description is merely exemplary, and an output circuit that carries out P/S conversion in K ($2 \leq K \leq N$) stages in a $2^N$-bit prefetch scheme can be implemented in a similar manner.

(a) 8-bit prefetch (N=3)

In the case of a $2^3$ (=8)-bit prefetch scheme, an output circuit that carries out P/S conversion in two or three stages can be configured.

(a-1) 2-stage P/S conversion

Figure 15:
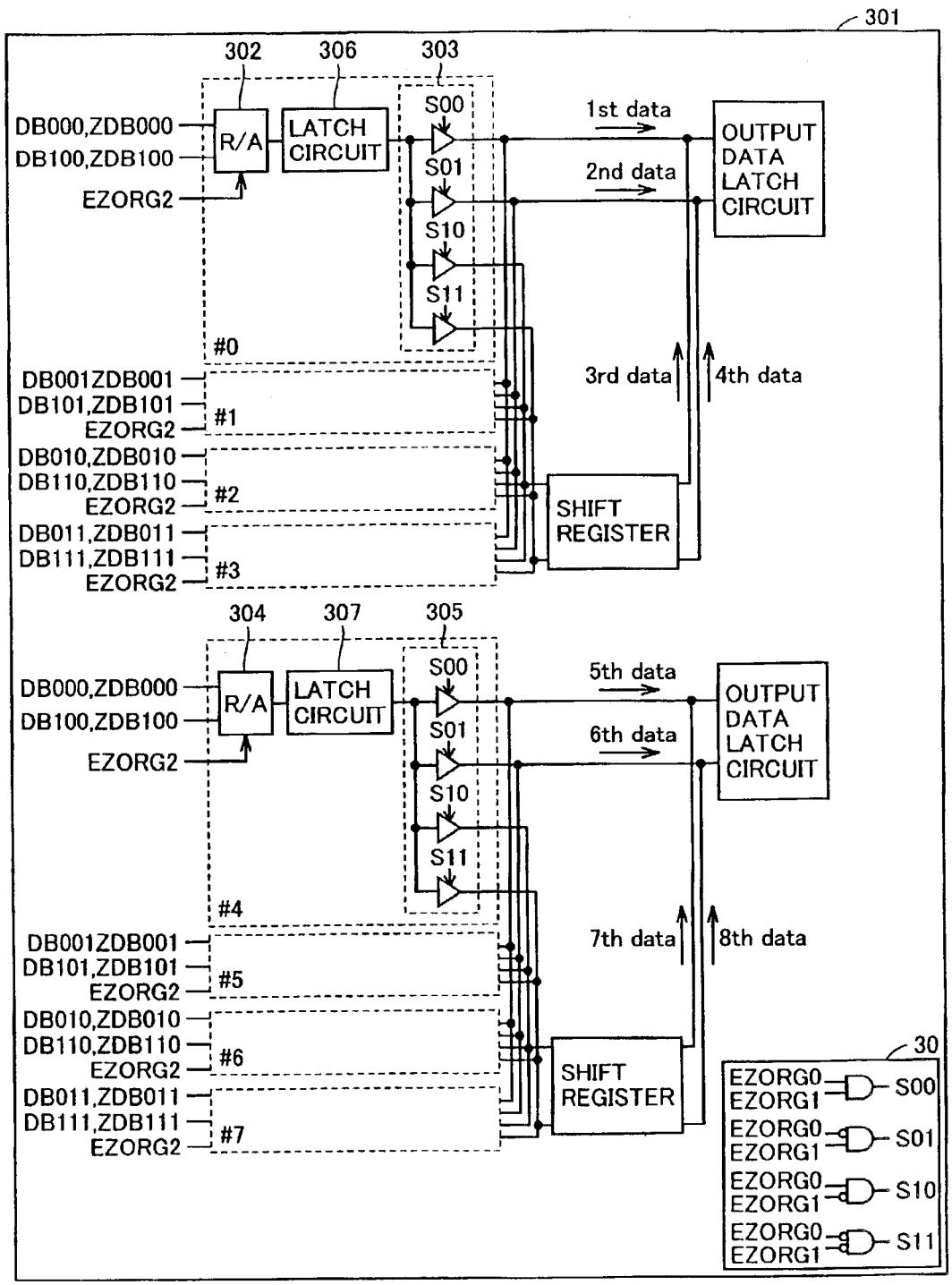
FIG. 15 shows a structure of an output circuit 301 that sets in order 8-bit prefetched data in two stages.

FIG. 15 shows a structure of an output circuit 301 that sets the order of 8-bit prefetched data in two stages.

First, the eight data are subjected to the first stage of ordering at eight amplifier circuits (R/A). Each amplifier circuit provides the input data to the switch circuit for the first half (first to fourth data) or to the switch circuit for the last half (fifth to eighth data) based on the value of control signal EZORG2. The structure of the amplifier circuit will be described in detail based on amplifier circuit 302 and amplifier circuit 304 as representative thereof.

Figure 16:
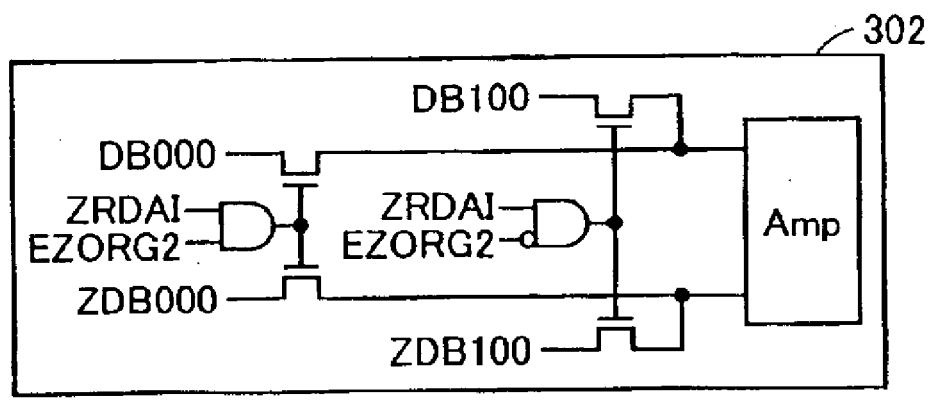
FIGS. 16 and 17 show a structure of an amplifier circuit 302 and an amplifier circuit 304, respectively.

Amplifier circuit 302 shown in FIG. 16 is connected to data bus pair DB000, ZDB000 and data bus pair DB100, ZDB100 to which data of a memory cell in the column specified by column addresses having a different value for CA2 and the same value for CA1 and CA0 (CA1=0, CA0=0) are output.

When EZORG2=1, amplifier circuit 302 responds to activation of control signal ZRDAI to have the data of data bus pair DB000, ZDB000 amplified by the amplifier and then provided to latch circuit 306. When EZORG2=0, amplifier circuit 302 responds to activation of control signal ZRDAI to have the data on data bus pair DB100, ZDB100 amplified by the amplifier and then provided to latch circuit 306.

Figure 17:
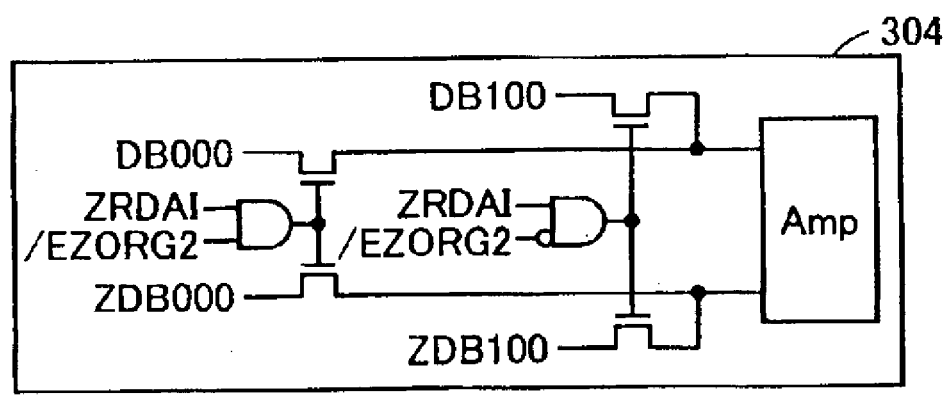

Amplifier circuit 304 shown in FIG. 17 has data bus pairs identical to those connected to amplifier circuit 302 connected.

When EZORG2=1, amplifier circuit 304 responds to activation of control signal ZRDAI to have the data of data bus pair DB100, ZDB100 amplified by the amplifier, and then provided to latch circuit 307. When EZORG2=0, amplifier circuit 307 responds to activation of control signal ZRDAI to have the data of data bus pair DB000, ZDB000 amplified by the amplifier, and then provided to latch circuit 307.

Then, at the four switch circuits for the first half, the second stage of ordering is conducted for the input data of the first half. Each switch circuit receives one data for output onto data lines in any of the first to fourth order based on the values of signals EZORG1 and EZORG0.

At the four switch circuits for the last half, the second stage of ordering is carried out for the input data of the first half. Each switch circuit receives one data for output onto data lines in any of the fifth to eighth order based on the values of signals EZORG1 and EZORG0. The operation of switch circuits 303 and 305 is similar to that of the switch circuit of conventional output circuit 101 of FIG. 5.

(a-2) 3-stage P/S conversion

Figure 18:
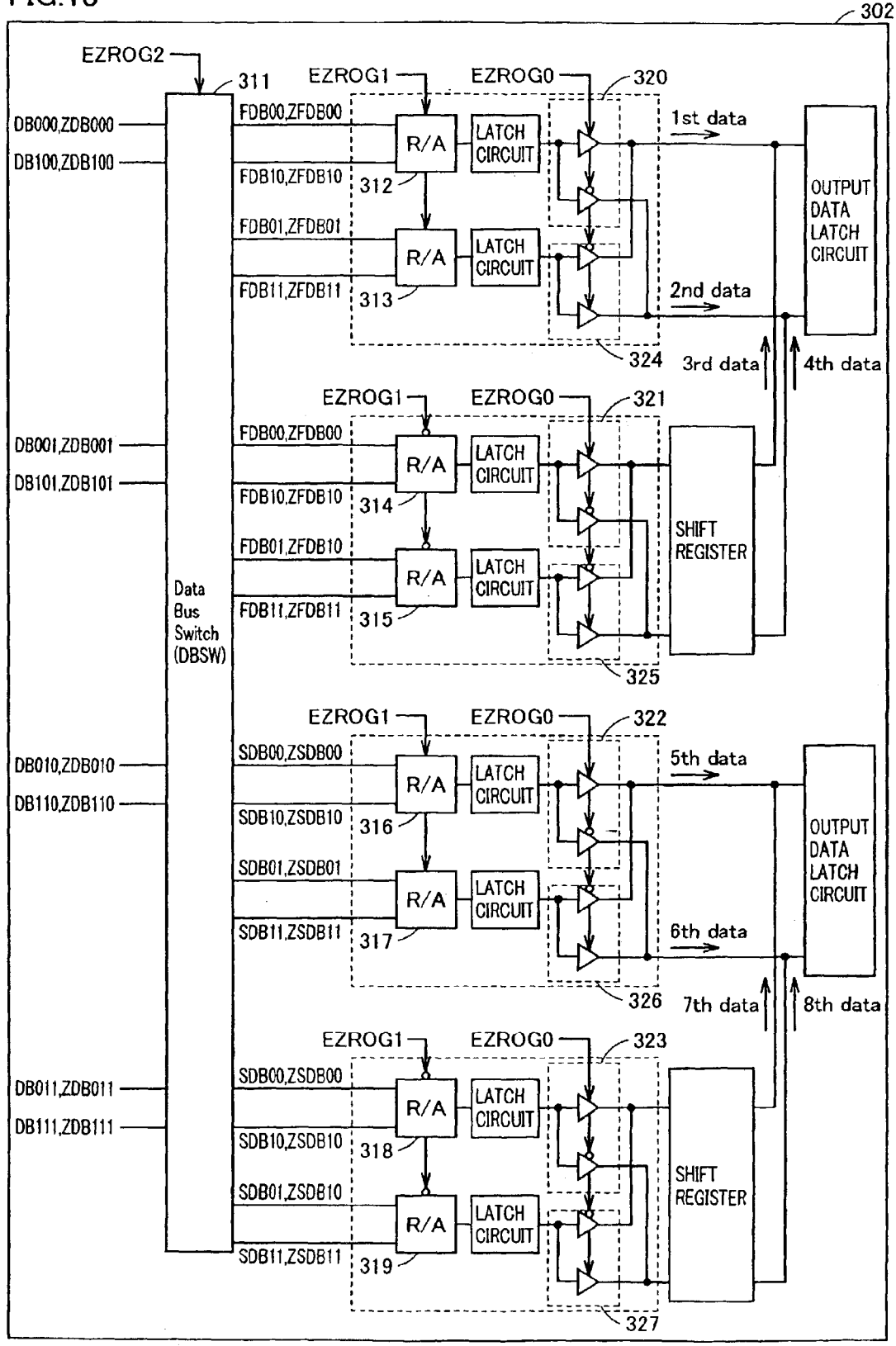
FIG. 18 shows a structure of an output circuit 302 that sets in order 8-bit prefetched data in three stages.

FIG. 18 shows a structure of an output circuit 302 that conducts ordering in 3 stages on 8-bit prefetched data.

At a data bus switch 311, the first stage of ordering is conducted on the eight data.

Figure 19:
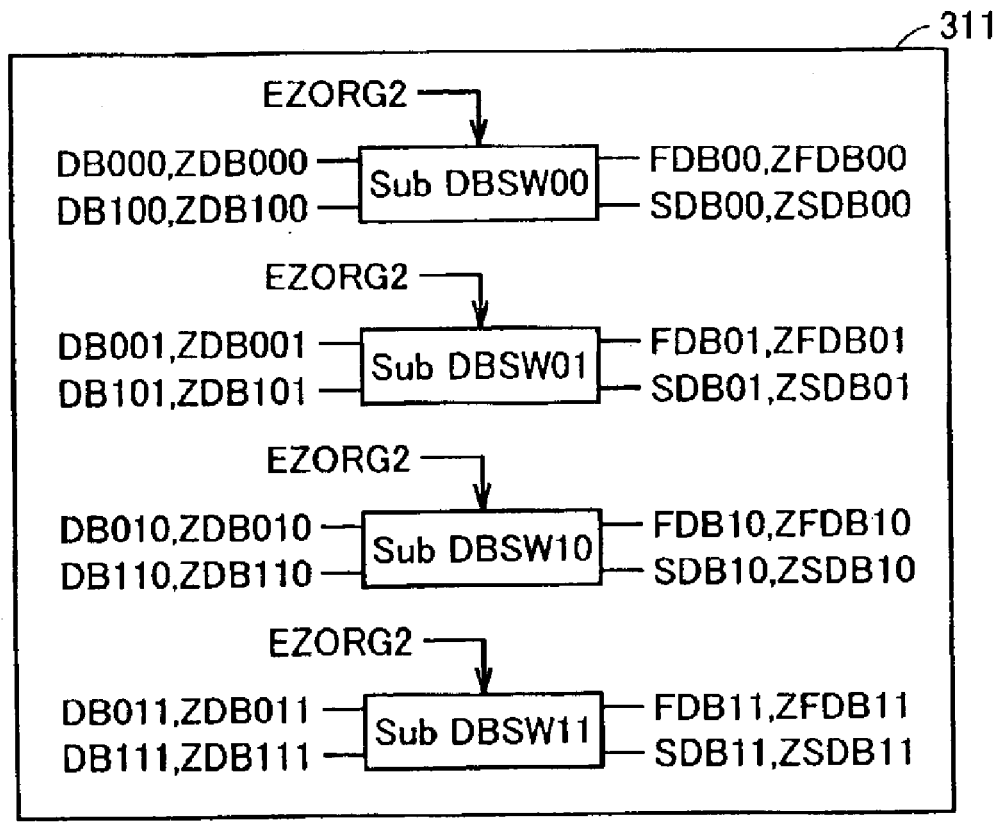
FIG. 19 shows a structure of a data bus switch 311.

Data bus switch 311 shown in FIG. 19 includes switch circuits Sub DBSW00, Sub DBSW01, Sub DBSW10, and Sub DBSW11 to connect the eight data bus pairs to either the first group of data bus pairs FDBxy, ZFDBxy (xy=00, 01, 10, 11) or the second group of data bus pairs SDBxy, ZSDBxy (xy=00, 01, 10, 11). The first group of data bus pairs FDBxy, ZFDBxy (xy=00, 01, 10, 11) are connected to amplifier circuits 312–315. The second group of data bus pairs SDBxy, ZSDBxy (xy=00, 01, 10, 11) are connected to amplifier circuits 316–319.

Figure 20:
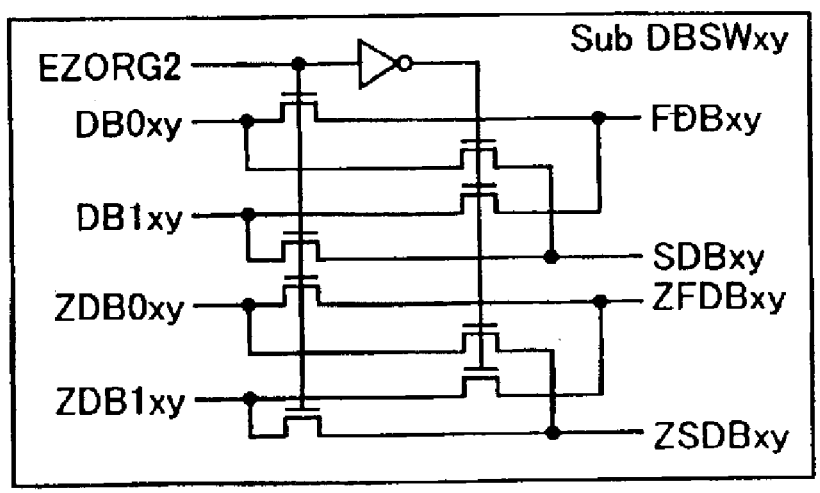
FIG. 20 shows a structure of a switch circuit Sub DBSWxy (xy=00, 01, 10, 11).

At switch circuit Sub DBSWxy (xy=00, 01, 10, 11) shown in FIG. 20, data bus pair DB0xy, ZDB0xy is connected to FDBxy, ZFDBxy whereas data bus pair DB1xy, ZDB1xy is connected to SDBxy, SDBxy when EZORG2=1. When EZORG2=0, data bus pair DB0xy, ZDB0xy is connected to SDBxy, ZSDBxy whereas data bus pair DB1xy, ZDB1xy is connected to FDBxy, ZFDBxy.

Thus, the eight data of data bus pairs DBXXX, ZDBXXX (XXX=000, 001, 010, 011, 100, 101, 110, 111) are output to either the first group of data bus pairs FDB__XX, ZFDB__XX (XX=00, 01, 10, 11) or the second group of data bus pairs SDB__XX, ZSDB__XX (XX=00, 01, 10, 11).

At amplifier circuits 312–315, the second stage of ordering is conducted on the four data of the first group of data bus pairs based on the value of EZORG1. At amplifier circuits 316–319, the second stage of ordering is conducted on the four data of the second group of data bus pairs based on the value of control signal EZORG1.

At switch circuits 320–327, the third stage of ordering is carried out on respective input data based on the value of control signal EZORG0.

The operations of amplifier circuits 312–319 and switch circuits 320–327 are similar to those of the amplifier circuit and switch circuit in the output circuit of the first embodiment shown in FIG. 8.

Eight switch circuits Sub DBSWxy, not four, may be provided. Specifically, the first group of four switch circuits Sub DBSxy provide data of one of the two connected data bus pairs onto FDBXX, ZFDBXX (data of the other data bus pairs is not output). The second group of four switch circuits Sub DBSxy are connected to data bus pairs identical to those of the first group of switch circuits to output the data of the other data bus pair onto SDBXX, ZSDBXX.

(b) 16-bit prefetch (N=4)

When in a $2^4$ (=16) bit prefetch scheme, ordering is conducted in two stages, three stages, or four stages.

(b-1) 2-stage P/S conversion

When ordering is conducted in two stages, the amplifier circuit (R/A) conducts the first stage of ordering according to control signal EZORG3. The switch circuit conducts the second stage of ordering according to control signals EZORG2, EZORG1, and EZORG0. In this case, 16 amplifier circuits are employed and 8 selectors are provided in the switch circuit. The control signal generation circuit generates control signals S000, S001, S010, S011, S100, S101, S110, S111 based on control signals EZORG2, EZORG1, and EZORG0 for output to the switch circuit.

(b-2) 3-stage P/S conversion

When sequencing is to be conducted in three stages, the data bus switch conducts the first stage of ordering according to signal EZORG3. At the amplifier circuit (R/A), the second stage of ordering is conducted to signal EZORG2. The switch circuit conducts the third stage of ordering according to signals EZORG1 and EZORG0.

In this case, the number of switch circuits Sub DBSW included in the data bus switch is eight. The number of amplifier circuits is 16. The number of selectors in switch circuit is 4.

(b-3) 4-stage P/S conversion

When sequencing is to be conducted in four stages, the data bus switch conducts ordering of the first stage and the second stage according to signals EZORG3 and EZORG2. Specifically, the data bus switch is formed of two stages so as to set the order of sixteen data into the first half (first and second group) or the last half (third group and fourth group). At the second stage, the eight data of the first half are ordered in either the first group or the second group. The eight data of the latter half are ordered in either the third group or the fourth group.

The amplifier circuit (R/A) conducts the third stage of ordering according to signal EZORG1. The switch circuit responds to signal EZORG0 to conduct the fourth stage of ordering.

The number of data bus switches corresponds to the eight sub switches for the first stage and the eight sub switches for the second stage. There are sixteen amplifier circuits and two selectors in the switch circuit.

(c) $2^N$-bit prefetch

When in a $2^N$-bit prefetch scheme, ordering is conducted in K ($2 \leq K \leq N$) stages.

At the data switch bus of (K−2) stages, the first stage to (K−2)th stage of ordering are carried out. In the switch circuit in the amplifier circuit (R/A), the (K−1)th stage of ordering is conducted. At the switch circuit of the last stage, the Kth stage of ordering is conducted according to signal EZORG(N−K) to EZORG0.

Each switch circuit Sub DBSWxy in the data switch bus that conducts the S (S=1 to K−1)th stage of ordering and each switch circuit in the amplifier circuit (generically referred to as "switch circuit" hereinafter) is applied with two data of memory cells specified by two column addresses having a different value for only the (N−S+1)th bit from the least significant bit of the column address, i.e., differing at only CA (N−S). Based on the value of EZORG (N−S), one of the two data is applied to the switch circuit that outputs the input data previous to the switch circuit to which the other data is input among the switch circuits that conduct the (S+1)th stage of ordering.

Additionally, the switch circuit of the Sth stage may output the other data to the switch circuit that outputs the input data later than the switch circuit to which the one data is input among the switch circuits that conduct the (S+1)th stage of ordering.

Each of the switch circuits that conducts the Kth stage of ordering (last stage) is input with any of the data of $2^{(N-K+1)}$ memory cells specified by column addresses having a different value for only the least significant (N−K+1)th bit of the column address, i.e. differing at only CA0–CA (N−K), and outputs the input data in the order of $2^{(N-K+1)}$ ways according to signal EZORG (N−K)–EZORG0.

(3) In the second embodiment, four switch circuits are provided in read circuit 700. Alternatively, 8 switch circuits may be provided instead. Specifically, the first group of four switch circuits provides data of one of the two connected I/O line pairs to DB__FXX, ZDB__XX (data of the other I/O line pair is not output). The second group of switch circuits are connected to I/O line pairs identical to those of the first group of switch circuits, and provides data of the other I/O line pair to DB__SXX, ZDB__SXX.

(4) In the second embodiment, only 1-stage switch circuit is provided in read circuit 700. However, the number of switch circuits is not limited to 1.

In the case of $2^N$-bit prefetch, K1 stages of switch circuits, i.e. the first to K1 ($1 \leq K1 \leq N$)th stages of switch circuits, can be provided in the read circuit, and K2 stages of switch circuits, i.e. the (K1+1)th to (K1+K2)th stage ($1 \leq K2 \leq N$, $2<(K1+K2)<N$) of switch circuits, may be provided.

When K1≧2, each of the switch circuits that carries out the Sth (S=1 to (K1−1)) stage of ordering in the read circuit is applied with two data of memory cells specified by two column addresses having a different value for the least significant (N−S+1)th bit, i.e., differing at only CA (N−S) of the column address. Based on the value of signal EZORG (N−S), one of the two input data is to be output to the switch circuit that outputs the input data previous to the switch circuit that is input with the other data among the switch circuits that conduct the (S+1)th stage of ordering.

Additionally, this switch circuit may output the other data to the switch circuit that outputs the input data later than the switch circuit to which the one data is input among the switch circuits that conduct the (S+1)th stage of ordering.

The switch circuit that conducts the K1th stage of ordering in the read out circuit is similar to the switch circuit described in the second embodiment. Specifically, each switch circuit that conducts the K1th stage of ordering in the read out circuit is applied with two data of memory cells specified by two column addresses having a different value for the least significant (N−K1+1)th bit, i.e. differing at only CA (N−K1) of the column address, and provides one of the two input data onto the data bus included in data bus group DB_FXX and the other data onto the data bus in data bus pair DB_SXX based on the value of signal EZORG (N−K1). The data output onto the data bus in data bus pair group DB_FXX is provided to the output circuit previous to the data output onto the data bus in data bus pair group DB_SXX.

As to the above K1 and K2, the relationship of K<K2 may be imposed. Accordingly, much of the P/S conversion processing can be conducted at the output circuit that essentially conducts P/S conversion.

(5) In the above-described embodiments and modifications, the switch circuits in the read circuit and the output circuit excluding the last-stage switch circuit are described so as to set the order corresponding to one bit of an external column address. This is merely exemplary, and the switch circuits excluding the last-stage switch circuit may conduct ordering corresponding to two or more bits. In this case, the switch circuit of the last stage may carry out ordering corresponding to 1 bit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cells arranged in a matrix,
a read circuit for reading out simultaneously data of $2^N$ (N≧2) memory cells in said plurality of memory cells based on an externally applied column address for output onto $2^N$ data bus pairs; and
an output circuit for sequentially setting in order the data of said $2^N$ data bus pairs in K (2≦K≦N) stages based on said externally applied column address, wherein
said read circuit simultaneously reads out data of memory cells specified by column addresses all having common upper bits but the least significant N bits, said common upper bits being identical to all upper bits but the least significant N bits of said externally applied column address, and
said output circuit comprises a plurality of switch circuits corresponding to each said stage, said plurality of switch circuits setting in order the data of said $2^N$ data bus pairs in said stages based on a value of 1 or a plurality of bits for each said stage among the least significant N bits of said externally applied column address.

2. The semiconductor memory device according to claim 1, wherein each of switch circuits corresponding to an S (S=1 to K−1)th stage has two data input of memory cells specified by two column addresses having different values at only the least significant (N−S+1)th bit of the column address, and provides, based on a value of the least significant (N−S+1)th bit of said externally applied column address, one of said two input data to a switch circuit that outputs input data previous to the switch circuit to which said other input data is input among switch circuits that conduct ordering of the (S+1)th stage.

3. The semiconductor memory device according to claim 2, wherein said each of switch circuits corresponding to the Sth stage outputs said other data to a switch circuit that outputs input data later than the switch circuit to which said one data is input among switch circuits that conduct the (S+1)th stage of ordering.

4. The semiconductor memory device according to claim 1, wherein each of switch circuits corresponding to the Kth stage has data input of any memory cell of specified by $2^{(N-K+1)}$ column addresses having different values from the least significant bit to the (N−K+1)th bit of a column address, and outputs said input data in any order of $2^{(N-K+1)}$ ways based on values in the least significant bit to the (N−K+1)th bit of said externally applied column address.

5. A semiconductor memory device comprising:
a plurality of memory cells arranged in a matrix,
a read circuit for simultaneously reading out data of $2^N$ (N≧2) memory cells in said plurality of memory cells onto $2^N$ (N≧2) input/output lines based on an externally applied column address to sequentially set in order the data output onto said input/output lines in K1 stages of the first to K1 (1≦K1≦N)th stage, and providing each data onto a data bus pair included in a data bus pair group corresponding to the order of said data among $2^{K1}$ data bus pair groups; and
an output circuit for sequentially setting in order data of a data bus pair included in said each data bus pair group in K2 stages of the (K1+1)th to (K1+K2) th stage (1≦K2<N, 2≦(K1+K2)≦N) based on said externally applied column address.

6. The semiconductor memory device according to claim 5, wherein
said read circuit simultaneously reads out data of memory cells specified by column addresses all having common upper bits but the least significant N bits of said externally applied column address, and
said read circuit and said write circuit include a plurality of switch circuits corresponding to each stage of ordering,
wherein, when K1≧2, each of switch circuits corresponding to the Sth stage (S=1 to (K1−1)) included in said read circuit has two data input of memory cells specified by two column addresses having a different value at only the least significant (N−S+1)th bit of a column address, and provides, based on a value of the least significant (N−S+1)th bit of said externally applied column address, one of said two input data to a switch circuit that outputs input data previous to a switch circuit to which said other input data is input, and said other data to a switch circuit that outputs input data later than a switch circuit to which said one data is input, among switch circuits that sets the order of the (S+1)th stage.

7. The semiconductor memory device according to claim 6, wherein each of switch circuits corresponding to the K1th stage has two data input of memory cells specified by two column addresses having a different value at only the least significant (N−K+1)th bit of a column address, and provides, based on a value of the least significant (N−K1+1)th bit of said externally applied column address, one of said two input data to a data bus pair included in a data bus pair group that outputs data from said read circuit to said output circuit previous to the data bus pair included in the data bus pair group to which said other input data is output, and provides said other data to a data bus pair included in the data bus pair group that outputs data received from said read circuit to said output circuit later than the data bus pair included in the data bus pair group to which said one input data is output.

* * * * *